US 10,475,808 B2

United States Patent
Jiang et al.

(10) Patent No.: US 10,475,808 B2
(45) Date of Patent: Nov. 12, 2019

(54) THREE DIMENSIONAL MEMORY DEVICE AND METHOD FOR FABRICATING THE SAME

(71) Applicant: MACRONIX INTERNATIONAL CO., LTD., Hsinchu (TW)

(72) Inventors: Yu-Wei Jiang, Hsinchu (TW); Jia-Rong Chiou, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 69 days.

(21) Appl. No.: 15/690,337

(22) Filed: Aug. 30, 2017

(65) Prior Publication Data

US 2019/0067315 A1    Feb. 28, 2019

(51) Int. Cl.
| | | |
|---|---|---|
| *H01L 51/05* | (2006.01) | |
| *H01L 29/66* | (2006.01) | |
| *H01L 21/02* | (2006.01) | |
| *H01L 29/10* | (2006.01) | |
| *H01L 29/775* | (2006.01) | |
| *H01L 29/78* | (2006.01) | |

(Continued)

(52) U.S. Cl.
CPC .. *H01L 27/11582* (2013.01); *H01L 21/31116* (2013.01); *H01L 21/31144* (2013.01)

(58) Field of Classification Search
CPC .......... H01L 27/11551–11556; H01L 27/2454; H01L 29/7827; H01L 21/823487; H01L 21/823885; H01L 21/76224–76237; H01L 21/823481; H01L 21/823878
See application file for complete search history.

(56) References Cited

U.S. PATENT DOCUMENTS

| | | | |
|---|---|---|---|
| 7,927,966 B2 | 4/2011 | Nguyen Hoang et al. | |
| 9,012,278 B2* | 4/2015 | Xie | H01L 21/823814 438/199 |
| 9,324,731 B1 | 4/2016 | Lai | |

(Continued)

FOREIGN PATENT DOCUMENTS

| | | |
|---|---|---|
| TW | I277126 | 3/2007 |
| TW | I559371 | 11/2016 |

OTHER PUBLICATIONS

TIPO Office Action dated Sep. 5, 2018 in Taiwan application (No. 106129950).

*Primary Examiner* — Mary A Wilczewski
*Assistant Examiner* — Tsz K Chiu
(74) *Attorney, Agent, or Firm* — McClure, Qualey & Rodack, LLP

(57) ABSTRACT

A 3D memory device includes a substrate, a multi-layers stack and a dielectric material. The substrate has a concave portion extending along a first direction into the substrate from a surface thereof. The multi-layers stack includes a plurality of conductive layers and a plurality of insulating layers alternatively stacked along the first direction on a bottom of the concave portion. The multi-layers stack also has at least one recess passing through the conductive layers and the insulating layers along the first direction, wherein the recess has a cross-sectional bottom profile and a cross-sectional opening profile perpendicular to the first direction and the cross-sectional bottom profile has a size substantially greater than that of the cross-sectional opening profile. The dielectric material is at least partially filled in the recess.

8 Claims, 21 Drawing Sheets

(51) Int. Cl.
*H01L 27/11582* (2017.01)
*H01L 21/311* (2006.01)

(56) References Cited

U.S. PATENT DOCUMENTS

| | | | |
|---|---|---|---|
| 9,437,609 B2* | 9/2016 | Huo | H01L 21/764 |
| 2009/0079089 A1 | 3/2009 | Brunnbauer et al. | |
| 2010/0206737 A1 | 8/2010 | Preisser | |
| 2011/0233648 A1* | 9/2011 | Seol | H01L 21/32137 |
| | | | 257/324 |
| 2012/0208347 A1* | 8/2012 | Hwang | H01L 27/1157 |
| | | | 438/430 |
| 2014/0061849 A1* | 3/2014 | Tanzawa | H01L 27/11531 |
| | | | 257/499 |
| 2015/0294917 A1 | 10/2015 | deVilliers | |

* cited by examiner

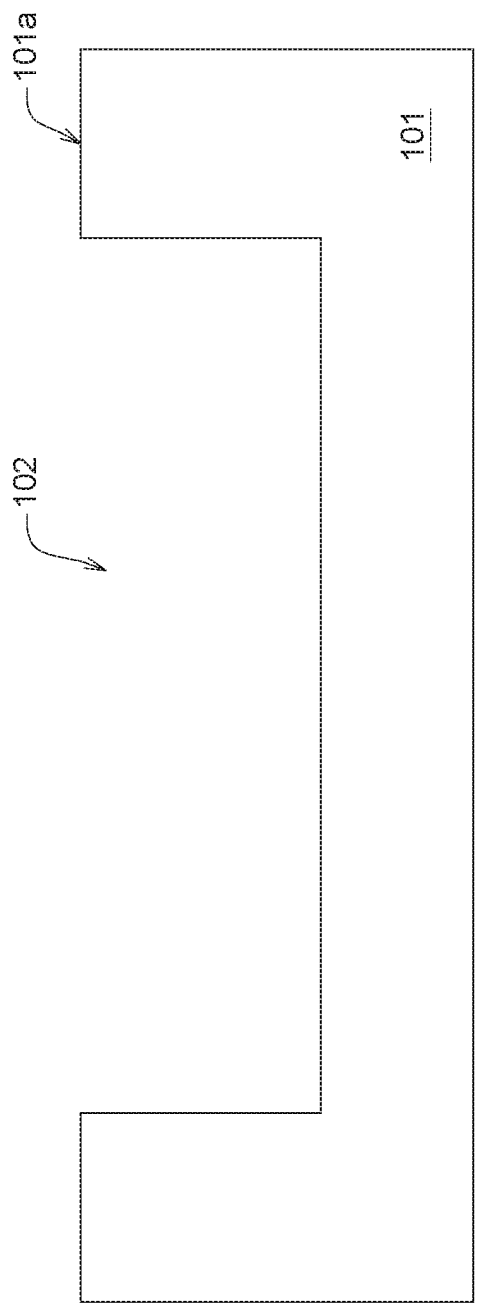

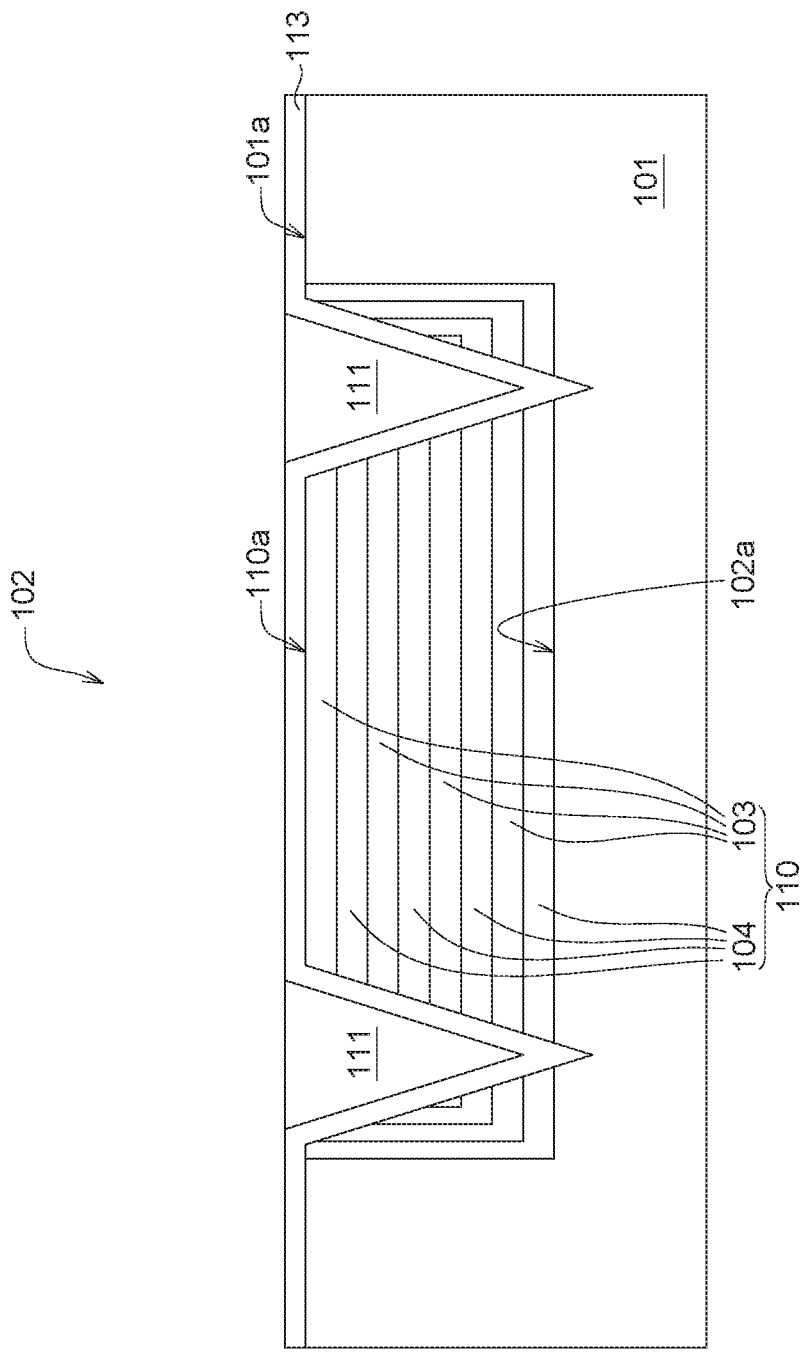

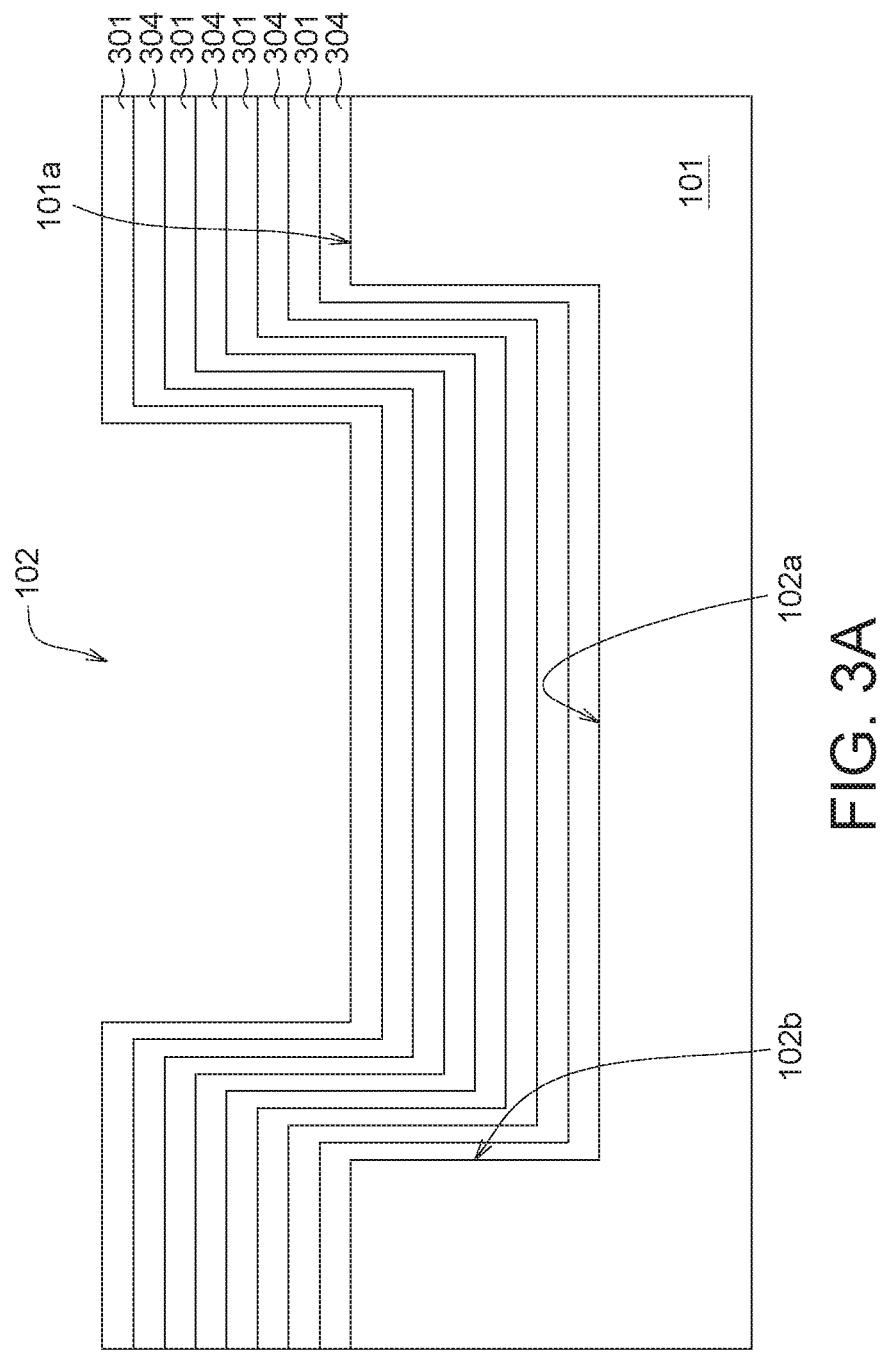

THREE DIMENSIONAL MEMORY DEVICE AND METHOD FOR FABRICATING THE SAME

BACKGROUND OF THE INVENTION

Field of the Invention

The invention relates in general to a memory device and the method for fabricating the same, and more particularly to a three-dimensional (3D) memory device and the method for fabricating the same.

Description of the Related Art

As the development of electrical technology, semiconductor memory devices have being broadly applied to various electronic products, such as MP3 players, digital cameras, notebooks, cell phones, etc. In order to accommodate the rising demand for reducing the size of the electronic products and improving the operation speed thereof, a 3D memory device having a higher density memory and excellent electrical characteristics, e.g. reliability in data storage and high operating speed, has been provided.

A typical 3D memory device, such as a 3D non-volatile memory (NVM) device, includes a 3D memory cell array configured by memory cell strings each of which has a vertical channel (VC). The method for fabricating a 3D memory device includes steps as follows: A multi-layers stack structure including plural of insulating layers and conductive layers alternatively stacked with each other is firstly formed on a substrate. The multi-layers stack is then patterned (etched) to form at least one trench therein, so as to divide the multi-layers stack into a plurality of ridge stacks each of which has a plurality of conductive stripes formed by the patterned conductive layers. A memory layer with an ONO composite structure (including a silicon oxide layer, a silicon nitride layer and another silicon oxide layer) and a channel layer are formed in sequence on the sidewalls of the ridge stacks, so as to define a plurality switches connected in series and disposed at the intersection points of the conductive stripes, the memory layer and the channel layer. The switches that is defined on the middle-levels conductive strips of each ridge stacks can serve as memory cells for being connected in series by the channel layer to form a memory cells string. The switch that are defined on the topmost conductive stripes of the ridge stacks may serve as string selection line (SSL) switches or a grounding selection line (GSL) switches of the memory cells string respectively.

In order to increase the memory density of the 3D memory device without shrinking the critical size thereof, the stacking number of the multi-layers stack is increased. However, the substrate, such as a silicon wafer, may be bend by the intrinsic stress and thermal stress due to the lattice miss match occurring on the interface of the conductive layer and the insulating layers with different materials and the thermal impact imposed to the conductive layer and the insulating layers during the process for fabricating the 3D memory device. The elements that are subsequently formed on the multi-layers stack may not be precisely aligned, and yield and the performance of the 3D memory device can be deteriorated due to the poor alignment. The problems of bended substrate may get worse when the stacking number of the multi-layers stack is increased.

Therefore, there is a need of providing a 3D memory device and the method for fabricating the same to obviate the drawbacks encountered from the prior art.

SUMMARY OF THE INVENTION

According to one embodiment of the present disclosure, a 3D memory device is provided, wherein the 3D memory device includes a substrate, a multi-layers stack and a dielectric material. The substrate has a concave portion extending along a first direction into the substrate from a surface thereof. The multi-layers stack includes a plurality of conductive layers and a plurality of insulating layers alternatively stacked along the first direction on a bottom of the concave portion. The multi-layers stack also has at least one recess passing through the conductive layers and the insulating layers along the first direction, wherein the recess has a cross-sectional bottom profile and a cross-sectional opening profile perpendicular to the first direction and the cross-sectional bottom profile has a size substantially greater than that of the cross-sectional opening profile. The dielectric material is at least partially filled in the recess.

According to another embodiment of the present disclosure, a method for fabricating a 3D memory device is provided, wherein the method includes steps as follows: Firstly, a substrate having a concave portion extending along a first direction into the substrate from a surface thereof is provided. A multi-layers stack having a plurality of conductive layers and a plurality of insulating layers alternatively stacked on a bottom of the concave portion along the first direction is then formed. Next, at least one recess passing through the conductive layers and the insulating layers along the first direction is formed in the multi-layers stack, wherein the recess has a cross-sectional bottom profile and a cross-sectional opening profile perpendicular to the first direction and the cross-sectional bottom profile has a size substantially greater than that of the cross-sectional opening profile. Subsequently, the recess is at least partially filled by a dielectric material.

According to yet another embodiment of the present disclosure, a method for fabricating a 3D memory device is provided, wherein the method includes steps as follows: A substrate, having a concave portion extending along a first direction into the substrate from a surface thereof is firstly provided. A plurality of sacrificing layers and a plurality of insulating layers are then formed to alternatively stack with each other along the first direction on a bottom of the concave portion. Next, at least one recess passing through the sacrificing layers and the insulating layers along the first direction is formed, wherein the at least one recess has a cross-sectional bottom profile and a cross-sectional opening profile perpendicular to the first direction, and the cross-sectional bottom profile has a size substantially greater than that of the cross-sectional opening profile. A dielectric material is then formed to at least partially fill the at least one recess. Thereafter, at least one through hole passing through the sacrificing layers and exposing portions of the sacrificing layers is formed. A memory layer is formed on sidewalls of the at least one through hole, and a channel layer is formed on the memory layer. Subsequently, the sacrificing layers is removed; and a plurality of conductive layers are formed on the positions where the sacrificing layers initially occupied, so as to define a plurality of memory cells at a plurality of intersection points of the conductive layers, the memory layer and the channel layer.

In accordance with the aforementioned embodiments of the present disclosure, a 3D memory device and the method for fabricating the same are provided. A multi-layers stack having a plurality of conductive layers and a plurality of insulating layers alternatively stacked is formed on a bottom of a concave portion of a substrate, and at least on recess passing through the conductive layers and the insulating layers along the stacking direction of the conductive layers and the insulating layers is formed in the multi-layers stack. The intrinsic stress and the thermal stress resulted in the bending of the substrate can be released, by forming the recess passing through the multi-layers stack.

In some embodiments of the present disclosure, the profile of the recess can be varied to further release the intrinsic stress and the thermal stress imposed by the conductive layers and the insulating layers. For example, a portion of the multi-layers stack is further removed through the recess to form at least one undercut at the bottom of the multi-layers stack, so as to enlarge the recess and to make the recess having a cross-sectional bottom profile and a cross-sectional opening profile perpendicular to the stacking direction of the conductive layers and the insulating layers, wherein the cross-sectional bottom profile has a size substantially greater than that of the cross-sectional opening profile, and the multi-layers stack has a cross-sectional profile flared from the surface of the substrate to the bottom of the concave portion. The bending of the substrate due to the intrinsic stress and the thermal stress can be further avoided by the design of the enlarged recess, and the elements that are subsequently formed on the multi-layers stack can be precisely aligned, and the yield and the performance of the 3D memory device can be improved.

The above and other aspects of the disclosure will become better understood with regard to the following detailed description of the preferred but non-limiting embodiment(s). The following description is made with reference to the accompanying drawings.

BRIEF DESCRIPTION OF THE DRAWINGS

FIGS. 1A to 1F are cross-sectional views illustrating the processing structures for fabricating a 3D memory device, in accordance with one embodiment of the present disclosure;

FIGS. 3A to 3H are cross-sectional views illustrating the processing structures for fabricating a 3D memory device, in accordance with yet another embodiment of the present disclosure.

DETAILED DESCRIPTION OF THE INVENTION

Figure 1B:
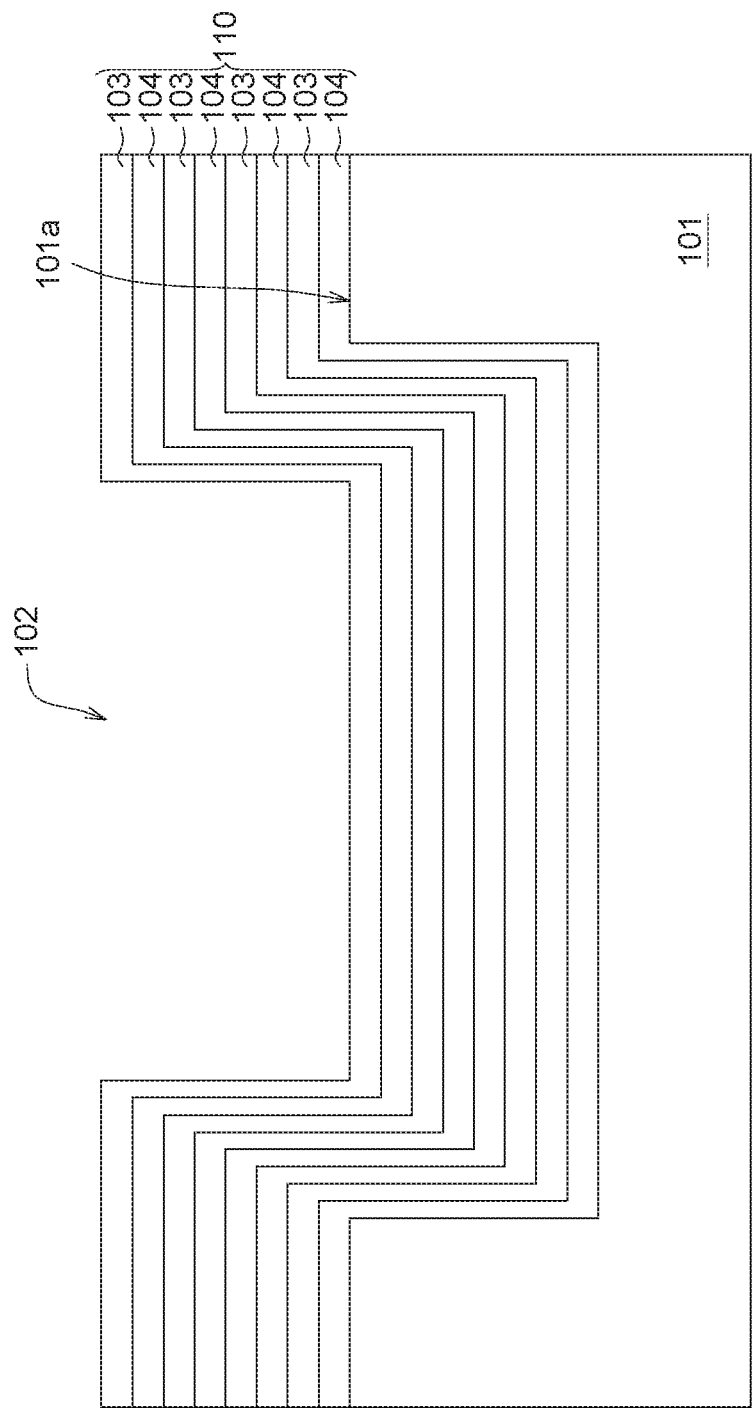
Figure 1C:
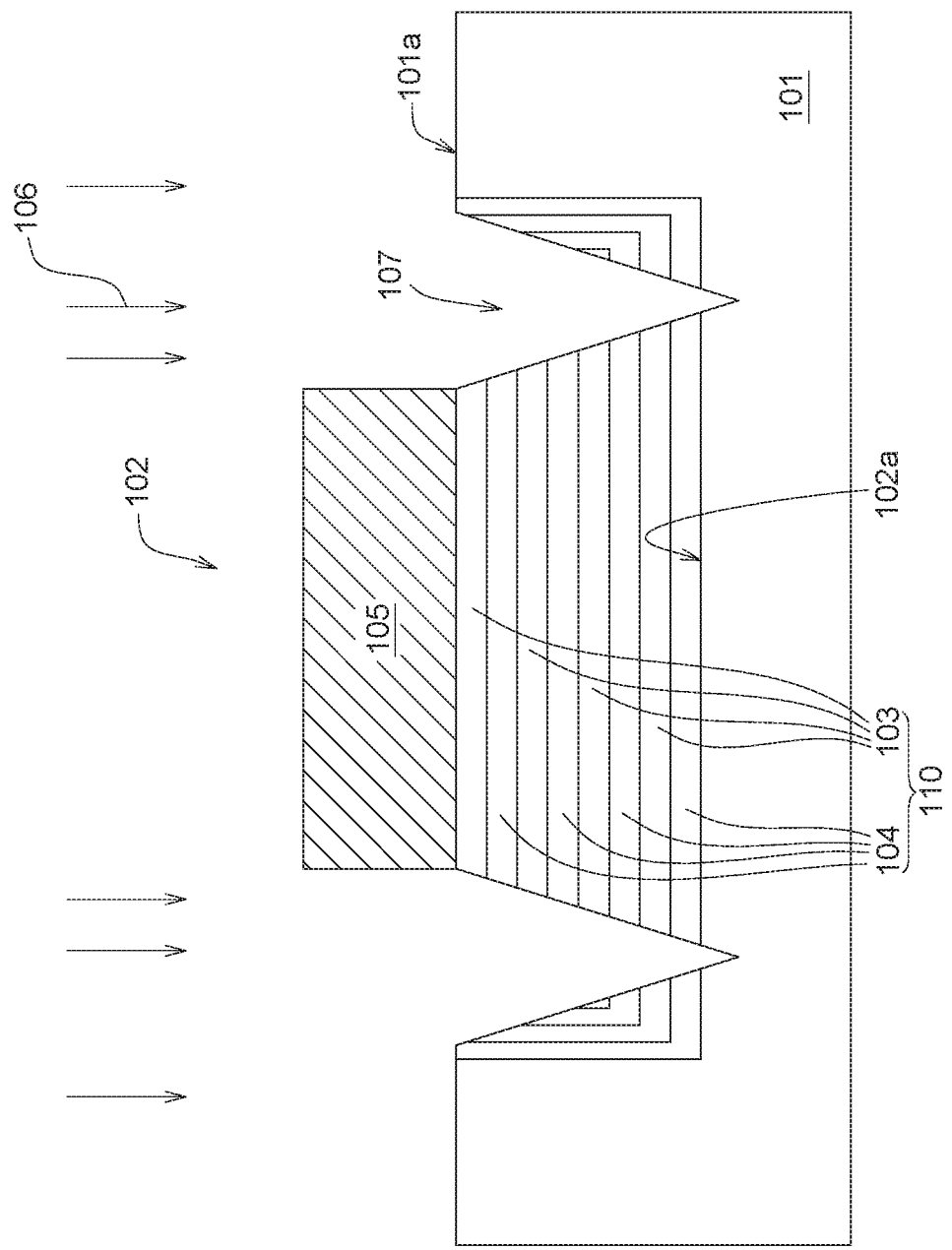
Figure 1E:
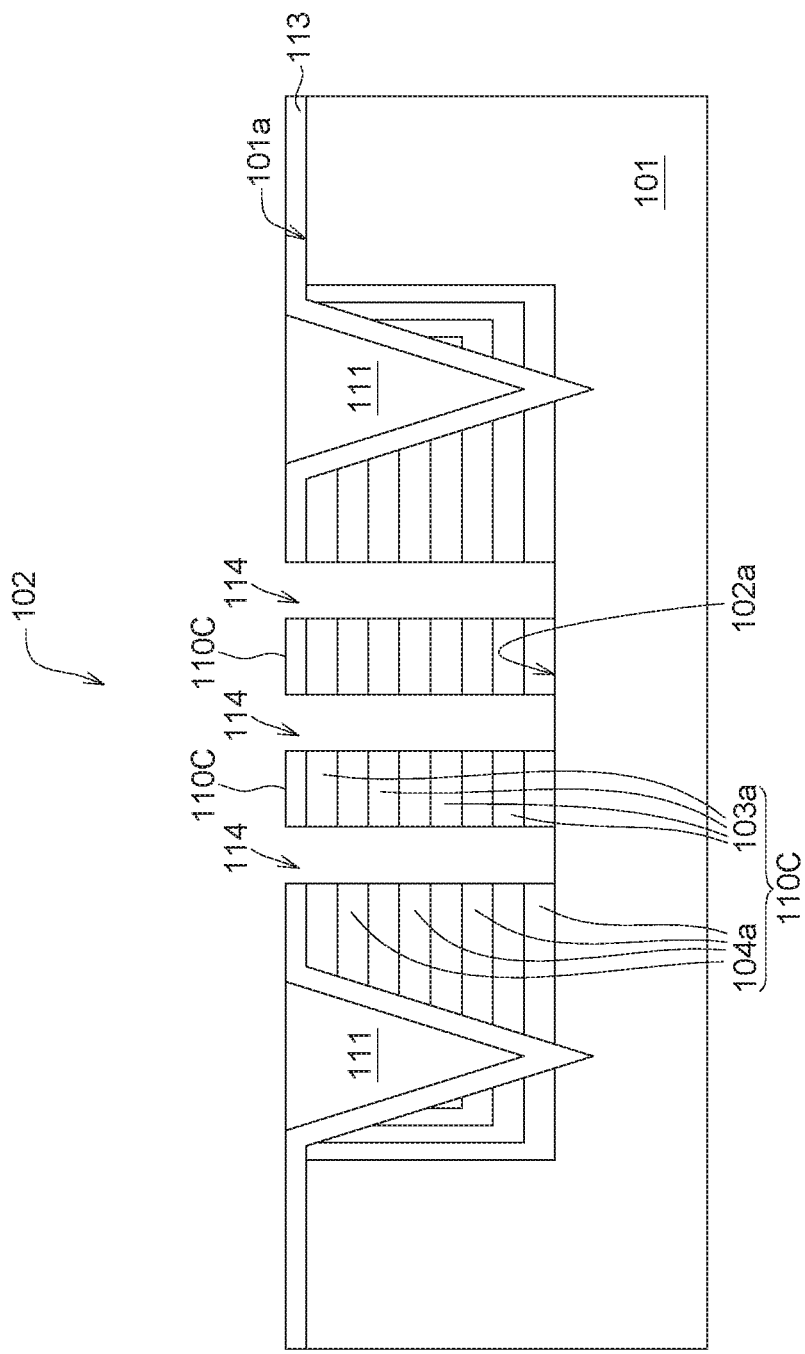

A 3D memory device and the method for fabricating the same is provided to avoid the bending of a substrate on which the 3D memory device is formed and to improve the yield and the performance of the 3D memory device. A number of embodiments of the present disclosure are disclosed below with reference to accompanying drawings.

However, the structure and contents disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the invention will be able to make suitable modifications or changes based on the specification disclosed below to meet actual needs without breaching the spirit of the invention. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

FIGS. 1A to 1F are cross-sectional views illustrating the processing structures for fabricating a 3D memory device 100, in accordance with one embodiment of the present disclosure. In some embodiments of the present disclosure, the 3D memory device 100 can be an NAND flash memory device with a U-shaped vertical channel. The method for forming the 3D memory device 100 includes steps as follows:

Firstly, a substrate 101 is provided, and a concave portion 102 is formed on a surface 101a of the substrate 101 (see FIG. 1A). In some embodiments of the present disclosure, the substrate 101 can be a semiconductor substrate made of semiconductor material, such as n-type poly-silicon, p-type poly-silicon, germanium or other suitable semiconductor material. In the present embodiment, the substrate 101 can be a silicon wafer made of un-doped poly-silicon.

In some embodiment, the concave portion 102 may be a recess formed by an anisotropic etching process, such as a reactive ion etching (RIE) process, performed on the surface 101a of the substrate 101 to remove a portion of the substrate 101 along a first direction. For example, in the present embodiment, the first direction can be (but not limited to) a direction parallel to the Z-axis, such that the concave portion 102 that is formed by the RIE process can be a recess having a horizontal bottom surface 102a perpendicular to the first direction (parallel to the X-Y plane) and a sidewall 102b extending from the surface 101a of the substrate 101 along the first direction to the bottom surface 102a of the concave portion 102, wherein the sidewalls 102b and the bottom surface 102a connected with each other. The concave portion 102 may have a rectangle cross-sectional profile parallel to the X-Y plane. Although, for purpose of clear description, only one concave portion 102 is illustrated I FIG. 1A, but it should be appreciated that there can be a plurality of concave portions 102 formed on the surface 101a of the substrate 101 (the silicon wafer).

Next, a multi-layers stack 110 is formed on the surface 101a of the substrate 101 and extending into the concave portion 102. The multi-layers stack 110 includes a plurality of conductive layer 103 and a plurality of insulating layers 104 parallel to each other and alternatively stacked along the first direction on the surface 101a of the substrate 101. In other words, each two adjacent ones of the conductive layers 103 are separated from each other by one of the insulating layers 104. Wherein the lowest layer of the insulating layers 104 may directly contact to the bottom surface 102a and the sidewalls 102b of the concave portion 102 as well as the surface 101a of the substrate 101; and the conductive layers 103 are electrically isolated from the substrate 101 by the insulating layers 104 (see FIG. 1B).

In some embodiments of the present disclosure, the insulating layers 104 may be made of dielectric material, such as silicon oxide ($SiO_x$), silicon carbide (SiC), silicate or the arbitrary combinations thereof. The conductive layers may include a conductive material, such as a doped or un-doped poly-silicon or metal. The conductive layers 103 and the insulating layers 104 may be formed by a deposition processes, e.g. low pressure chemical vapor deposition (LPCVD) respectively. The concave portion 102 has a depth substantially ranging from 1 micrometer (μm) to 10 μm. In the present embodiment, the conductive layers 103 can be made by poly-silicon; and the insulating layers 104 can be made by silicon dioxide ($SiO_2$). The concave portion 102 has a depth about 5 μm.

The multi-layers stack 110 is then patterned. In some embodiments of the present disclosure, a etching process 106 using a patterned photoresist layer 105 as a mask is performed to remove a portion of the multi-layers stack 110, so as to form at least one opening 107 extending along a direction parallel to the first direction from a top surface 110a of the multi-layers stack 110 towards to the bottom surface 102a of the concave portion 102. The etching process 106 may be an anisotropic etching process. For example, in the present embodiment, the etching process 106 can be a reactive ion etching (RIE) process using $CF_4$ or $CHF_3$ as the reactive gases used to remove the portion of the multi-layers stack 110 disposed on the surface 101a of the substrate 101 and the portion of the multi-layers stack 110 disposed in the concave portion 102 and uncovered by the patterned photoresist layer 105. In some embodiments of the present disclosure, the opening 107 may be flared from a top surface 110a of the multi-layers stack 110 towards to the bottom surface 102a of the concave portion 102, in accordance with the nature of the anisotropic etching process (see FIG. 1C).

After the patterned photoresist layer 105 is striped, a capping layer 113 is formed by a deposition process, such as a LPCVD process, covering on the bottom and sidewalls of the opening 107 as well as the surface 101a of the substrate 101. A dielectric material 111 is than deposited on the capping layer 113 and filling the opening 107. In some embodiments of the present disclosure, the capping layer 113 may be made of silicon nitride. The dielectric material 111 may be identical to or different from the material used to configure the insulating layers 104. In the present embodiment, the dielectric material 111 may include $SiO_2$. Subsequently, a planarization process, such as a chemical mechanical polishing (CMP) process, is performed to remove the portion of the dielectric material 111 disposed on the surface 101a of the substrate 101, so as to make the top surface 110a of the reaming portion of the multi-layers stack 110, the top surface of the dielectric material 111 disposed in the opening 107 and the surface 101a of the substrate 101 coplanar (see FIG. 1D).

The remaining multi-layers stack 110 is then patterned again to form a plurality of ridge stacks 110C in the remaining multi-layers stack 110. In some embodiments of the present disclosure, the process for patterning the remaining multi-layers stack 110 may include an anisotropic etching process, such as RIE process, performed on the top surface 110a of the multilayers stack to form at least one trench 114 extending into the remaining multi-layers stack 110 from the top surface 110a thereof along the direction parallel to the first direction, so as to divide the remaining multi-layers stack 110 into a plurality of ridge stacks 110C. Wherein, each of the ridge stacks 110C includes a plurality of conductive stripes 103a resulted from the patterned conductive layers; and each two adjacent ones of the conductive stripes 103a can be separated from each other by one of the insulating stripes 104a resulted from the patterned insulating layers 104 (see FIG. 1E).

Figure 1F:
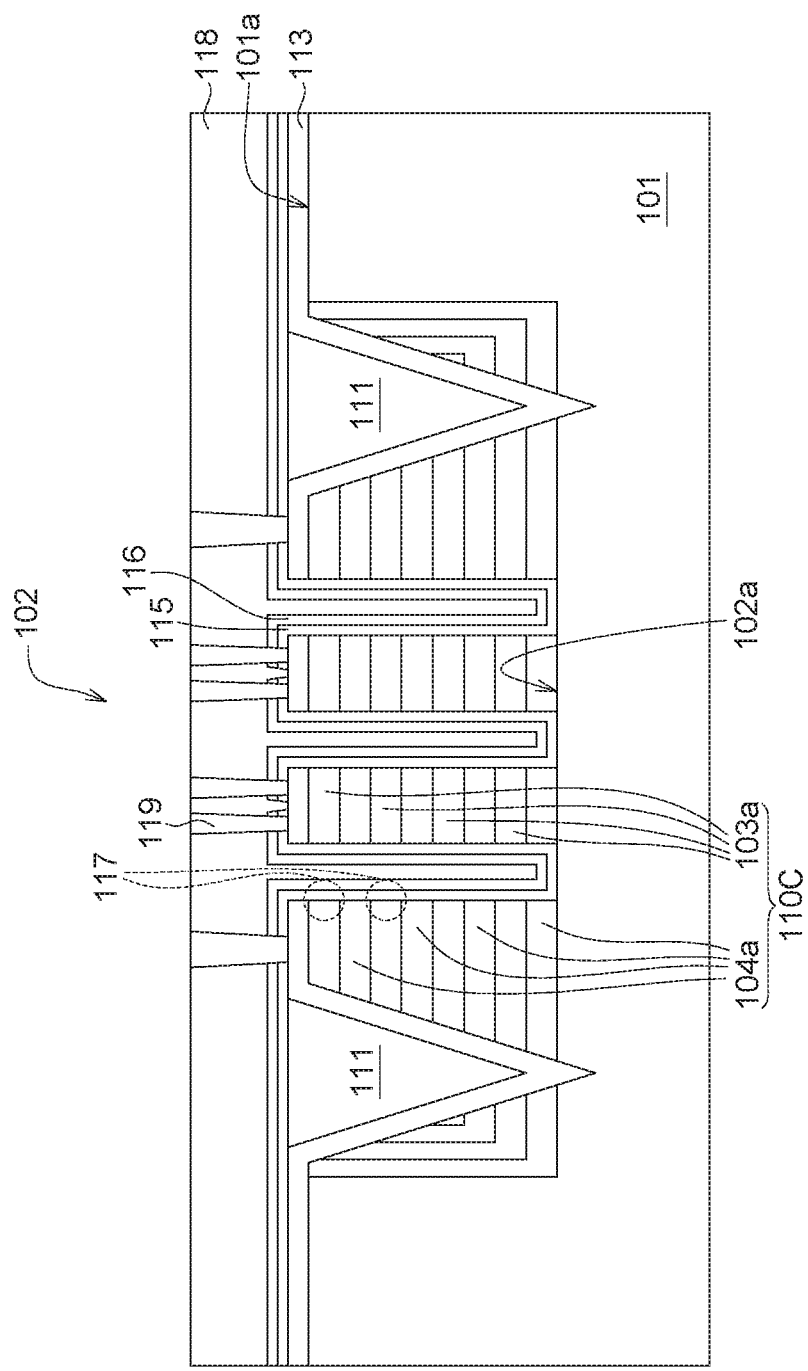

Next, a memory layer 115 and a channel layer 116 are formed on the sidewalls of the ridge stacks 110C in sequence, so as to define a plurality of memory cells 117 on the intersection points of the memory layer 115, the channel layer 116 and the conductive stripes 103a (see FIG. 1F). In some embodiments of the present disclosure, the memory layer 115 may include an ONO composite structure including a silicon oxide layer, a silicon nitride layer and another silicon oxide layer. The channel layer 116 can be made of doped or un-doped poly-silicon, silicide (e.g. TiSi, CoSi or SiGe), oxide semiconductors (e.g. InZnO or InGaZnO) or the arbitrary combinations thereof.

Subsequently, a plurality of downstream processes (not shown) are carried out, at least one inter-layer dielectric (ILD) 118, a plurality of interconnection structures 119 and connection wires, such as bit lines, word lines, common source line etc., are formed on the ridge stacks 110C, the memory layer 115 and the channel layer 116. Meanwhile, the 3D memory device 100 as shown in FIG. 1F can be accomplished.

FIGS. 2A to 2E are cross-sectional views illustrating the processing structures for fabricating a 3D memory device 200, in accordance with another embodiment of the present disclosure. In some embodiments of the present disclosure, the 3D memory device 200 can be a NAND flash memory device with a U-shaped vertical channel. The method for forming the 3D memory device 200 includes steps as follows:

Firstly, a substrate 101 is provided, and a concave portion 102 is formed on a surface 101a of the substrate 101 (see FIG. 1A). Next, a multi-layers stack 110 is formed on the surface 101a of the substrate 101 and extending into the concave portion 102 (see FIG. 1B). Since the material and the process for forming the substrate 101 and the multi-layers stack 110 have been discussed above, thus it will not be redundantly described here.

The multi-layers stack 110 is then patterned. In some embodiments of the present disclosure, a first etching process 206 using a patterned photoresist layer 205 as an etching mask is performed to remove a portion of the multi-layers stack 110 along a first direction, so as to form at least one opening 207 extending along a direction parallel to the first direction from a top surface 110a of the multi-layers stack 110 to the bottom surface 102a of the concave portion 102 (see FIG. 2A). In some embodiments of the present disclosure, the first direction can be (but not limited to) a direction parallel to the Z-axis. The first etching process 206 may be an anisotropic etching process. For example, in the present embodiment, the first etching process 206 can be a RIE process using $CF_4$ or $CHF_3$ as the reactive gases used to remove a portion of the multi-layers stack 110 disposed on the surface 101a of the substrate 101 and a portion of the multi-layers stack 110 disposed in the concave portion 102 that is not covered by the patterned photoresist layer 205.

Next, a second etching process 208 still using the patterned photoresist layer 205 as an etching mask is performed to thoroughly remove the portions of the reaming multi-layers stack 110 disposed on the surface 101a of the substrate 101; meanwhile a portion of the reaming multi-layers stack 110 disposed in the concave portion 102 is partially removed through the opening 207. As a result, the opening 207 can be enlarged to form a recess 209 having a bottom size greater than an opening size. In some embodiments of the present disclosure, the second etching process 208 can be an anisotropic etching process with a polymer-containing reactive gas. For example, in the present embodiment, the second etching process 208 can be low-bias plasma etching process using a reactive gas containing hexafluoro-2-butyne ($C_4F_6$), difluoromethane ($CH_2F_2$) or the combination thereof.

During the second etching process 208, the polymer provided by the reactive gas may be deposited on the surface 101a of the substrate 101 and cumulated at the entrance of the opening 207, but rarely deposited on the sidewalls and bottom of the opening 207. The polymer cumulated at the entrance of the opening 207 can protect the portion of the reaming multi-layers stack 110 adjacent to the entrance of the opening 207 from being removed, and restrict the etching plasma from flowing out of the opening 207. Such that the sidewalls of the opening 207 can be removed by the etching plasma. When the portion of the reaming multi-layers stack 110 disposed on the surface 101a of the substrate 101 is removed, a portion of the multi-layers stack 110 disposed in the concave portion 102 can be pull back during the second etching process 208, whereby at least one undercut 209a can be formed on the bottom of the multi-layers stack 110, and a recess 209 can be formed by combining the undercut 209a with the opening 207 to expose a portion of the substrate 101 therefrom.

Figure 2A:
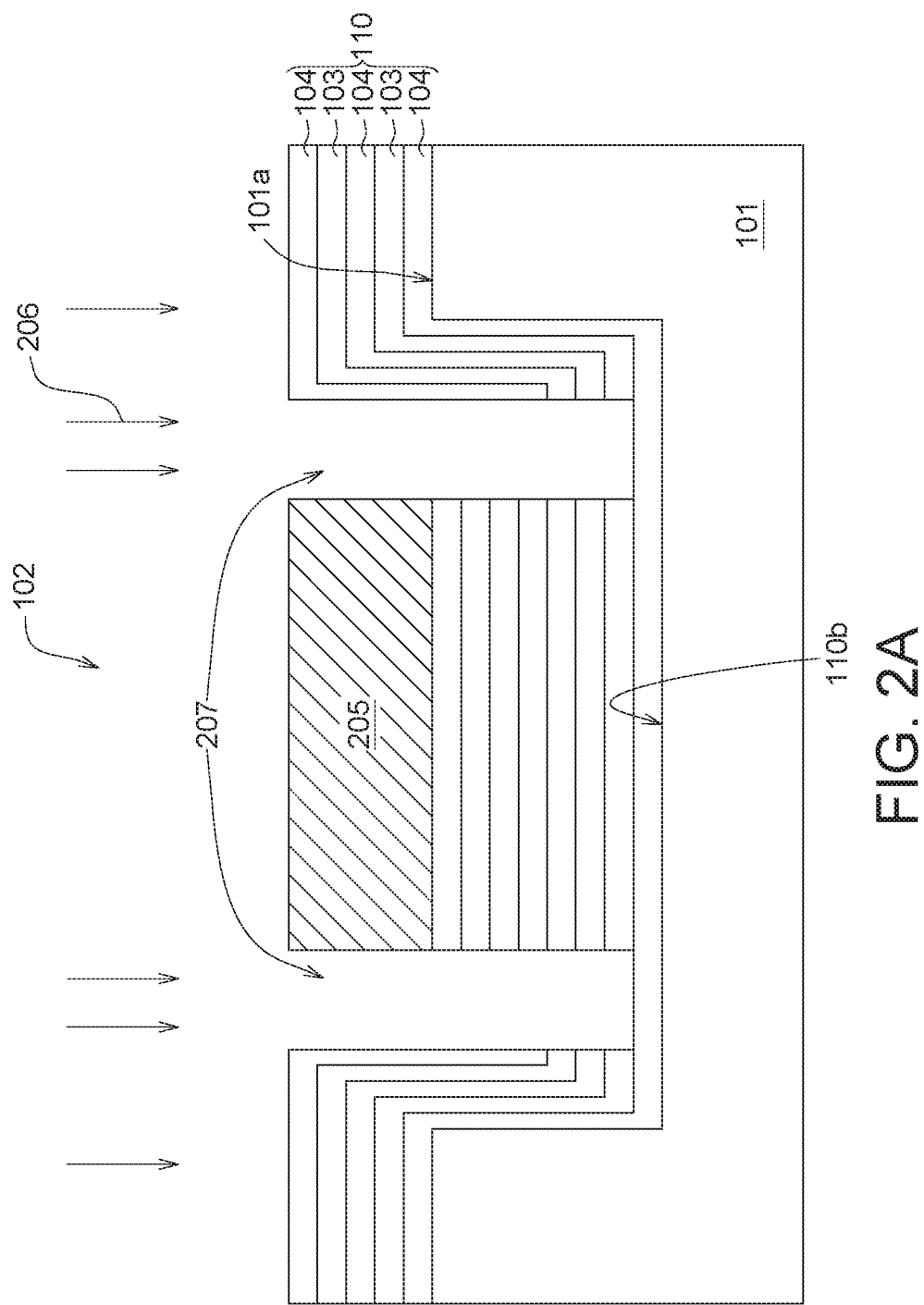
FIGS. 2A to 2E are cross-sectional views illustrating the processing structures for fabricating a 3D memory device, in accordance with another embodiment of the present disclosure.
Figure 2B:
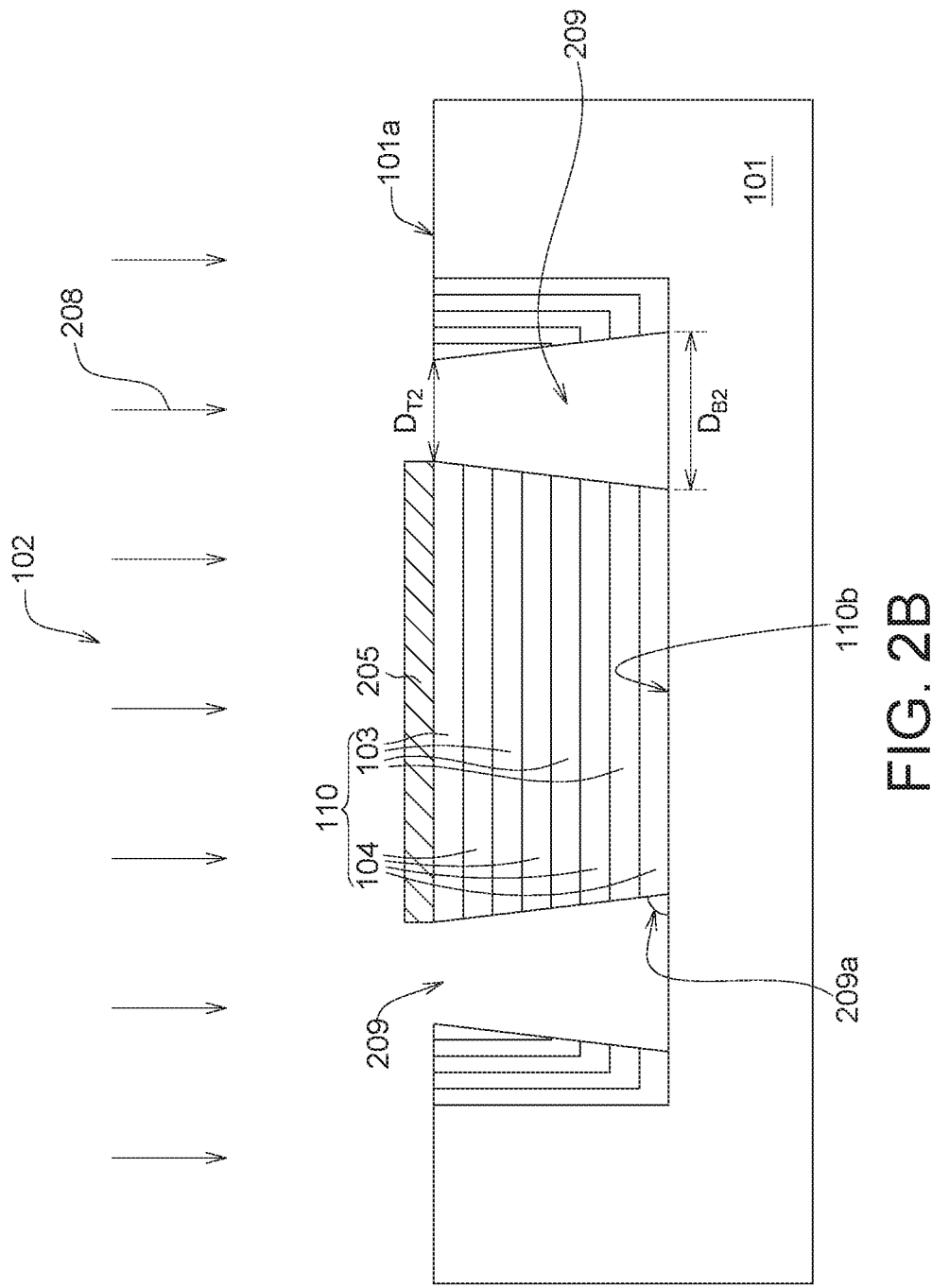

Because the amount of the polymer deposited on the sidewalls of the opening 207 may be less and less from the entrance to the bottom of the opening 207, the multi-layers stack 110 disposed in the concave portion 102 and subjected to the second etching process 208 can have a cross-sectional profile flared from the surface 101a of the substrate to the bottom surface 102a of the concave portion 102; and the recess 209 resulted from the second etching process 208 can have a cross-sectional bottom profile and a cross-sectional opening profile perpendicular to the direction parallel to the first direction, wherein the cross-sectional bottom profile has a size DB2 substantially greater than a size DT2 of the cross-sectional opening profile (see FIG. 2B). In some embodiments of the present disclosure, the ratio of the size DB2 of cross-sectional bottom profile to the size DT2 of the cross-sectional opening profile may range from 0.5 to 0.9 (0.5<DT2/DB2<0.9).

After the patterned photoresist layer 205 is striped, a capping layer 213 is formed by a deposition process, such as a LPCVD process, covering on the bottom and sidewalls of the recess 209 as well as the surface 101a of the substrate 101. A dielectric material 211 is then deposited on the capping layer 213 and at least partially filling the recess 209. In some embodiments of the present disclosure, the capping layer 213 may be made of silicon nitride. The dielectric material 211 may be identical to or different from the material used to configure the insulating layers 104. In the present embodiment, the dielectric material 211 may include $SiO_2$. The recess 209 can be partially filled with the dielectric material 211 rather than fulfilled. In the present embodiment, the dielectric material 211 merely covers on the sidewalls and the bottom of the recess 209 and seals the opening of the recess 209, whereby an air gap 212 is defined in the recess 209.

Figure 2C:
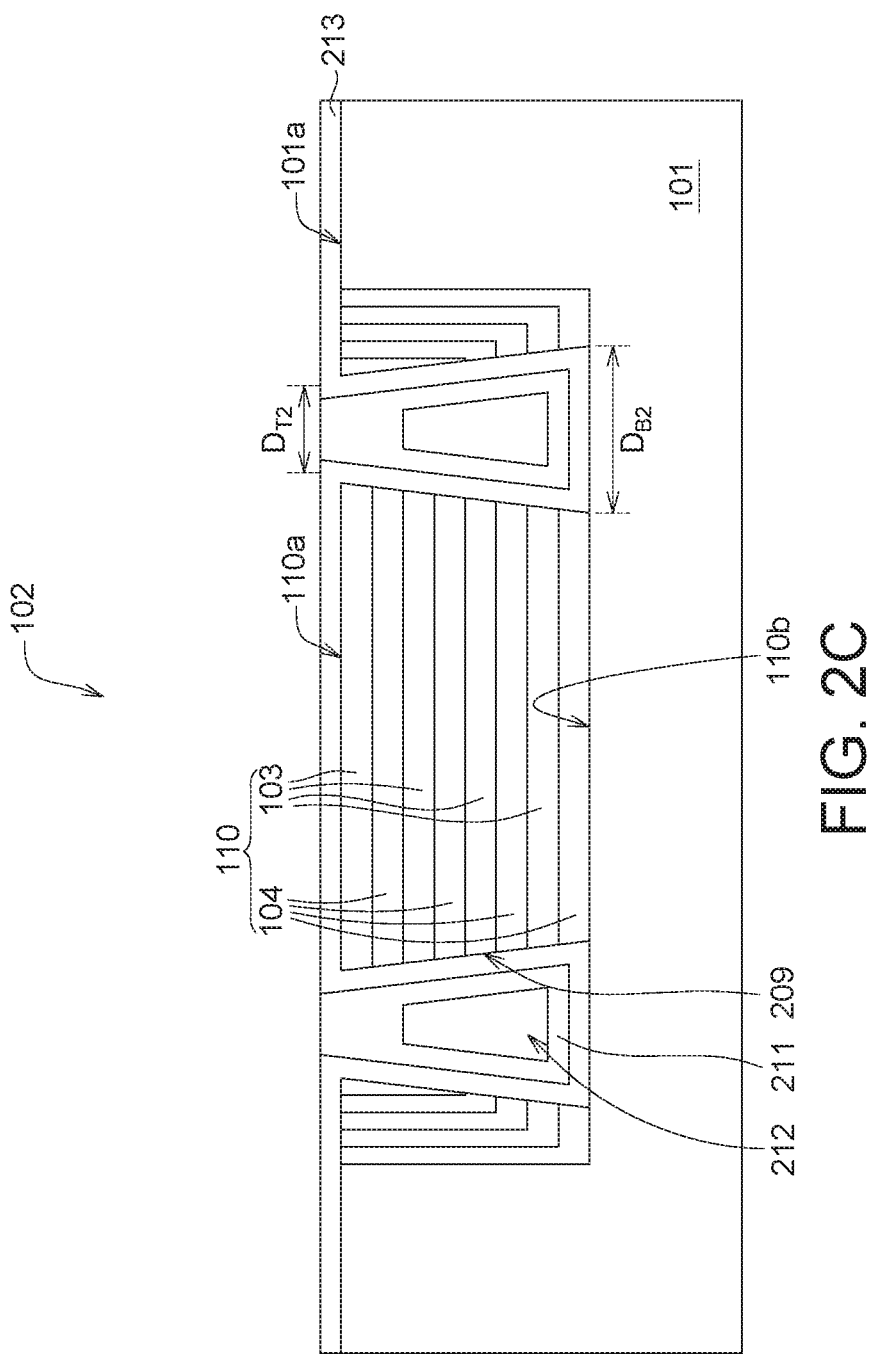
Figure 2D:
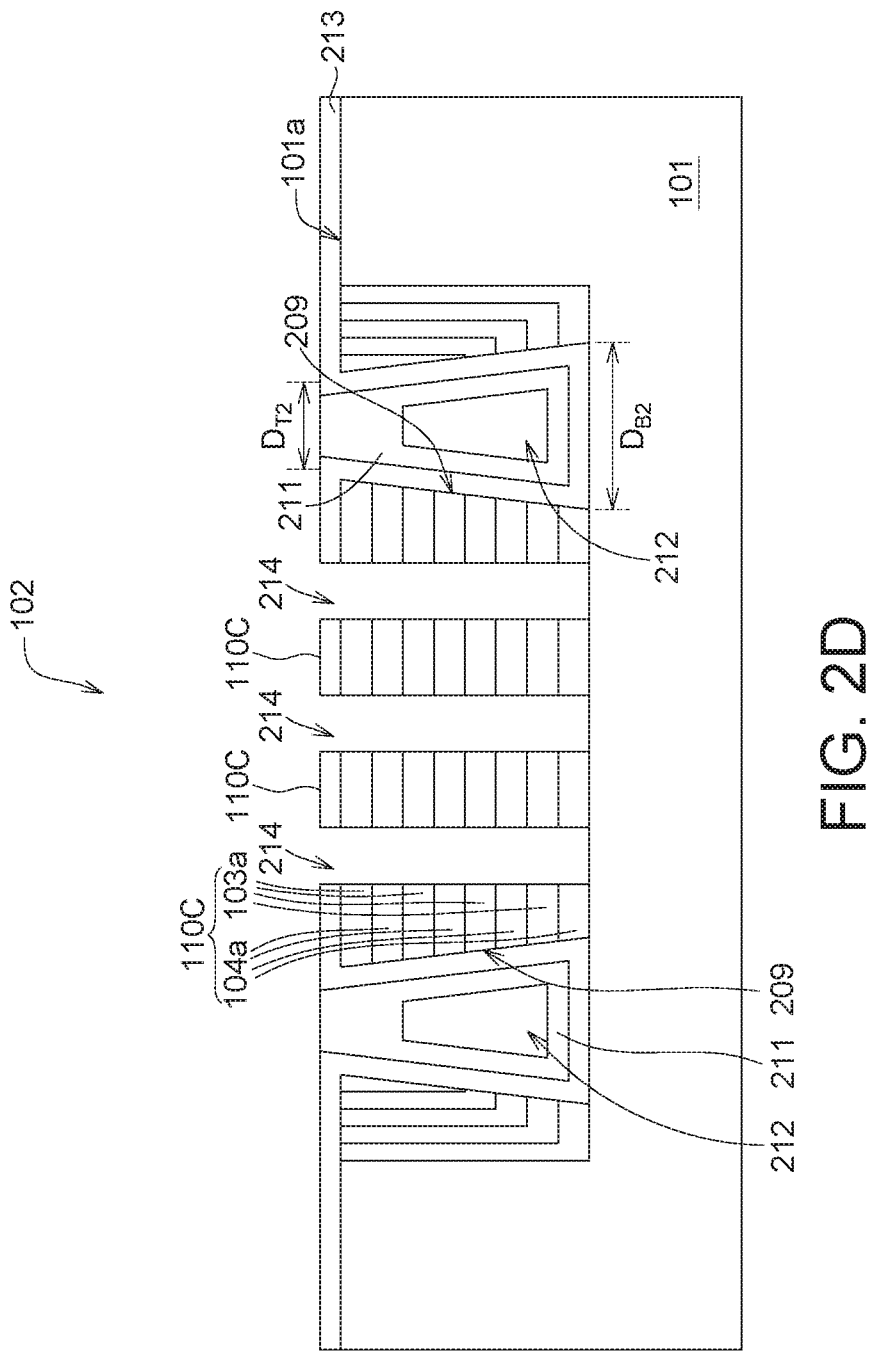

Subsequently, a planarization process, such as a CMP process, is performed to remove the portion of the dielectric material 211 disposed on the surface 101a of the substrate 101, so as to make the top surface 110a of the reaming portion of the multi-layers stack 110, the top surface of the dielectric material 211 disposed in the recess 209 and the surface 101a of the substrate 101 coplanar (see FIG. 2C). In some embodiments of the present disclosure, the air gap 212 departs from the top surface of the multi-layers stack 210 (the surface 101a of the substrate 101) for a distance substantially ranging from 500 angstrom (Å) to 1000 Å.

The multi-layers stack 110 disposed in the concave portion 102 is then patterned again to form a plurality of ridge stacks 210C in the multi-layers stack 110. In some embodiments of the present disclosure, the process for patterning the multi-layers stack 110 may include an anisotropic etching process, such as RIE process, performed on the top surface 110a of the multilayers stack to form at least one trench 214 extending into the multi-layers stack 110 from the top surface 110a thereof along the direction parallel to the first direction, so as to divide the multi-layers stack 110 into a plurality of ridge stacks 110C. Wherein, each of the ridge stacks 110C includes a plurality of conductive stripes 103a resulted from the patterned conductive layers 103; and each two adjacent ones of the conductive stripes 103a can be separated from each other by one of the insulating stripes 104a resulted from the patterned insulating layers 104 (see FIG. 2D).

Figure 2E:
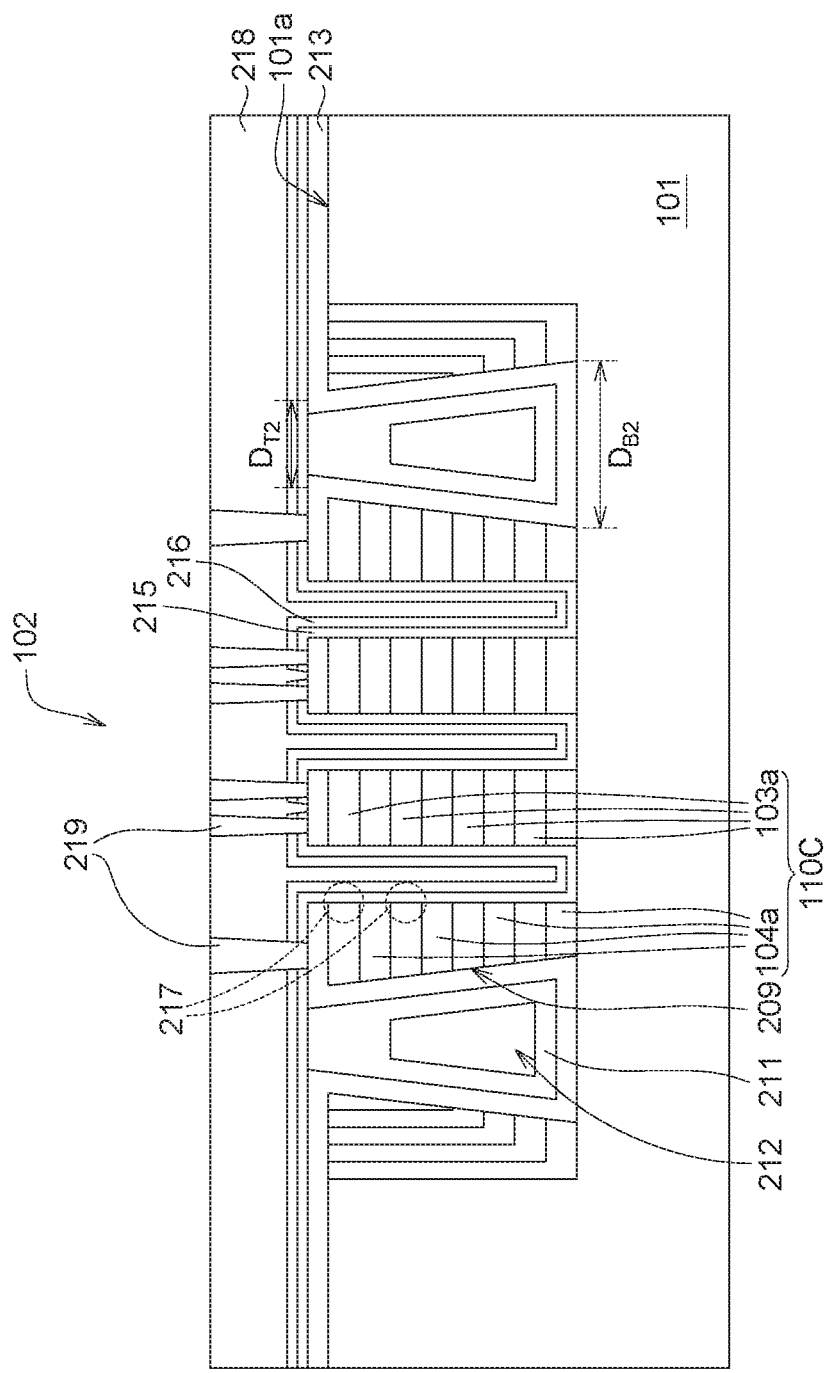

Next, a memory layer 215 and a channel layer 216 are formed on the sidewalls of the ridge stacks 110C in sequence, so as to define a plurality of memory cells 217 on the intersection points of the memory layer 215, the channel layer 216 and the conductive stripes 103a (see FIG. 2E). In some embodiments of the present disclosure, the memory layer 215 may include an ONO composite structure including a silicon oxide layer, a silicon nitride layer and another silicon oxide layer. The channel layer 216 can be made of doped or un-doped poly-silicon, silicide (e.g. TiSi, CoSi or SiGe), oxide semiconductors (e.g. InZnO or InGaZnO) or the arbitrary combinations thereof.

Subsequently, a plurality of downstream processes (not shown) are carried out, at least one ILD 218, a plurality of interconnection structures 219 and connection wires, such as bit lines, word lines, common source line (not shown) etc., are formed on the ridge stacks 110C, the memory layer 215 and the channel layer 216. Meanwhile, the 3D memory device 200 as shown in FIG. 2E can be accomplished.

FIGS. 3A to 3H are cross-sectional views illustrating the processing structures for fabricating a 3D memory device 300, in accordance with another embodiment of the present disclosure. In some embodiments of the present disclosure, the 3D memory device 300 can be a gate-all-around (GAA) NAND flash memory device with a vertical channel. The method for forming the 3D memory device 300 includes steps as follows:

Firstly, a substrate 101 is provided, and a concave portion 102 is formed on a surface 101a of the substrate 101 (see FIG. 1A). Since the material and the process for forming the substrate 101 have been discussed above, thus it will not be redundantly described here.

Next, a plurality of sacrificing layers 301 and a plurality of insulating layers 104 are formed on the surface 101a of the substrate 101 and extending into the concave portion 102. The sacrificing layers 301 and the insulating layers 304 are parallel to each other and alternatively stacked along the first direction on the surface 101a of the substrate 101. In other words, each two adjacent ones of the sacrificing layers 301 are separated from each other by one of the insulating layers 304. Wherein the lowest layer of the insulating layers 104 may directly contact to the bottom surface 102a and the sidewalls 102b of the concave portion 102 as well as the surface 101a of the substrate 101 (see FIG. 3A).

In some embodiments of the present disclosure, the insulating layers 304 and the sacrificing layers 301 may be formed by a deposition processes (e.g. a LPCVD) respectively. The material used to configure the sacrificing layers 301 may be different front that used to configure the insulating layers 304. For example, the sacrificing layers 301 may be made of silicon-containing nitride compounds, such as silicon nitride (SiN), silicon carbon nitride (SiCN), silicon oxynitride (SiON) or the arbitrary combinations thereof. The insulating layers 304 can be made by $SiO_x$, SiC, silicate or the arbitrary combinations thereof. In the present embodiment, the sacrificing layers 301 are made of SiN; and the insulating layers 304 are made of $SiO_2$.

The sacrificing layers 301 and the insulating layers 304 are then patterned. In some embodiments of the present disclosure, a first etching process 306 using a patterned photoresist layer 305 as an etching mask is performed to remove portions of the sacrificing layers 301 and the insulating layers 304, so as to form at least one opening 307 in the portions of the sacrificing layers 301 and the insulating layers 304 disposed in the concave portion 102 and at least partially passing through the sacrificing layers 301 and the insulating layers 304 (see FIG. 3B). The first etching process 306 may be an anisotropic etching process. For example, in the present embodiment, the first etching process 306 can be a RIE process using $CF_4$ or $CHF_3$ as the reactive gases used to remove portions of the sacrificing layers 301 and the insulating layers 304 disposed on the surface 101a of the substrate 101 and portions of the sacrificing layers 301 and the insulating layers 304 disposed in the concave portion 102 that is not covered by the patterned photoresist layer 305.

Next, a second etching process 308 still using the patterned photoresist layer 305 as an etching mask is performed to thoroughly remove the portions of the reaming sacrificing layers 301 and the insulating layers 304 disposed on the surface 101a of the substrate 101; meanwhile reaming portions of the sacrificing layers 301 and the insulating layers 304 disposed in the concave portion 102 is partially removed through the opening 307. As a result, the opening 307 can be enlarged to form a recess 309 having a bottom size greater than an opening size. In some embodiments of the present disclosure, the second etching process 308 can be an anisotropic etching process with a polymer-containing reactive gas. For example, in the present embodiment, the second etching process 208 can be low-bias plasma etching process using a reactive gas containing $C_4F_6$, $CH_2F_2$ or the combination thereof.

During the second etching process 308, the polymer provided by the reactive gas may be deposited on the surface 101a of the substrate 101 and cumulated at the entrance of the opening 307, but rarely deposited on the sidewalls and bottom of the opening 307. The polymer cumulated at the entrance of the opening 307 can protect the portion of the reaming sacrificing layers 301 and the insulating layers 304 adjacent to the entrance of the opening 307 from being removed, and restrict the etching plasma from flowing out of the opening 307. Such that the sidewalls of the opening 307 can be removed by the etching plasma. When the portion of the reaming sacrificing layers 301 and the insulating layers 304 disposed on the surface 101a of the substrate 101 is removed, a portion of the reaming sacrificing layers 301 and the insulating layers 304 disposed in the concave portion 102 can be pull back during the second etching process 308, whereby at least one undercut 309a can be formed on the bottom of the stack of the reaming sacrificing layers 301 and the insulating layers 304, and a recess 309 can be formed by combining the undercut 309a with the opening 307 to expose a portion of the substrate 101 therefrom.

Figure 3B:
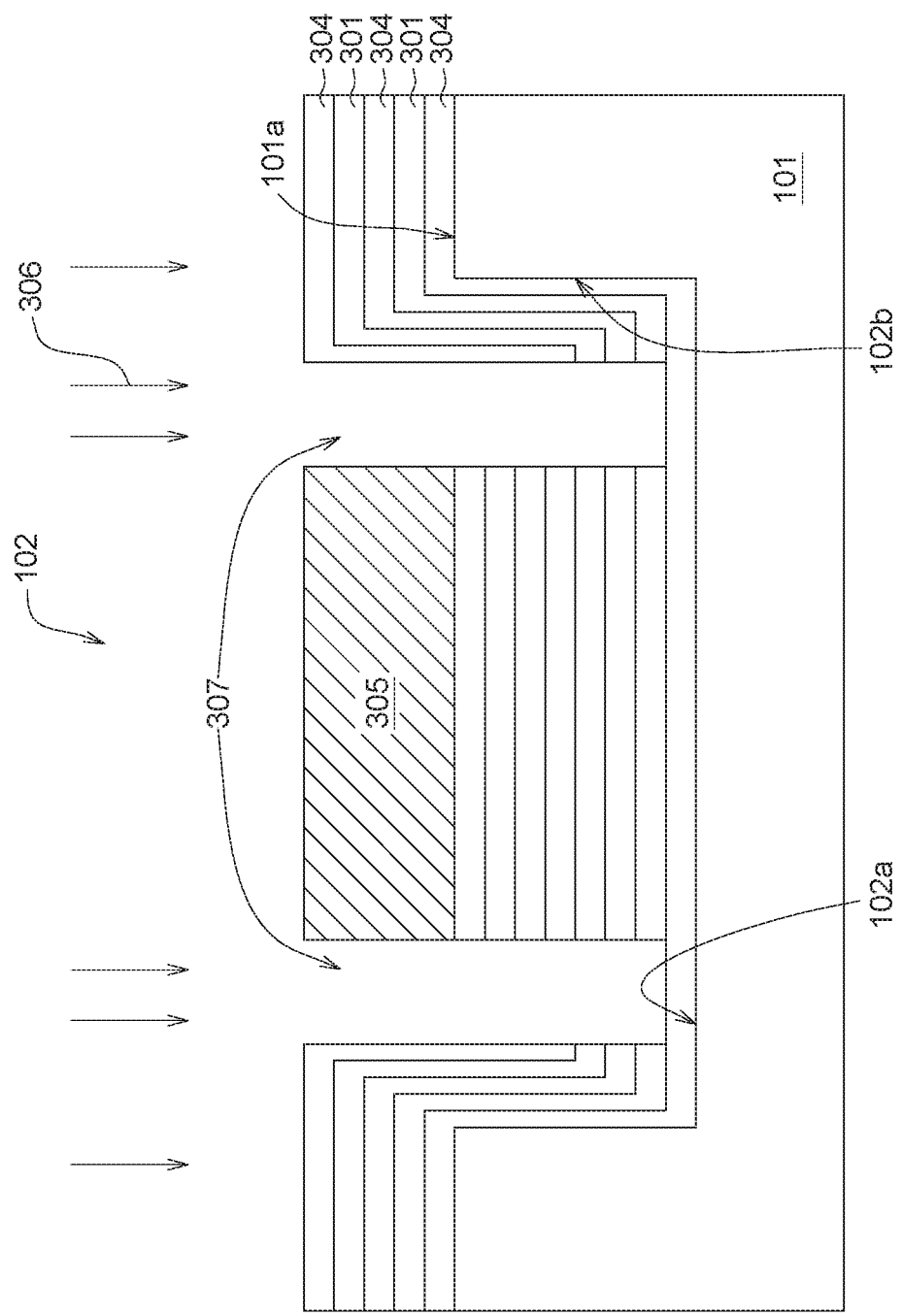
Figure 3C:
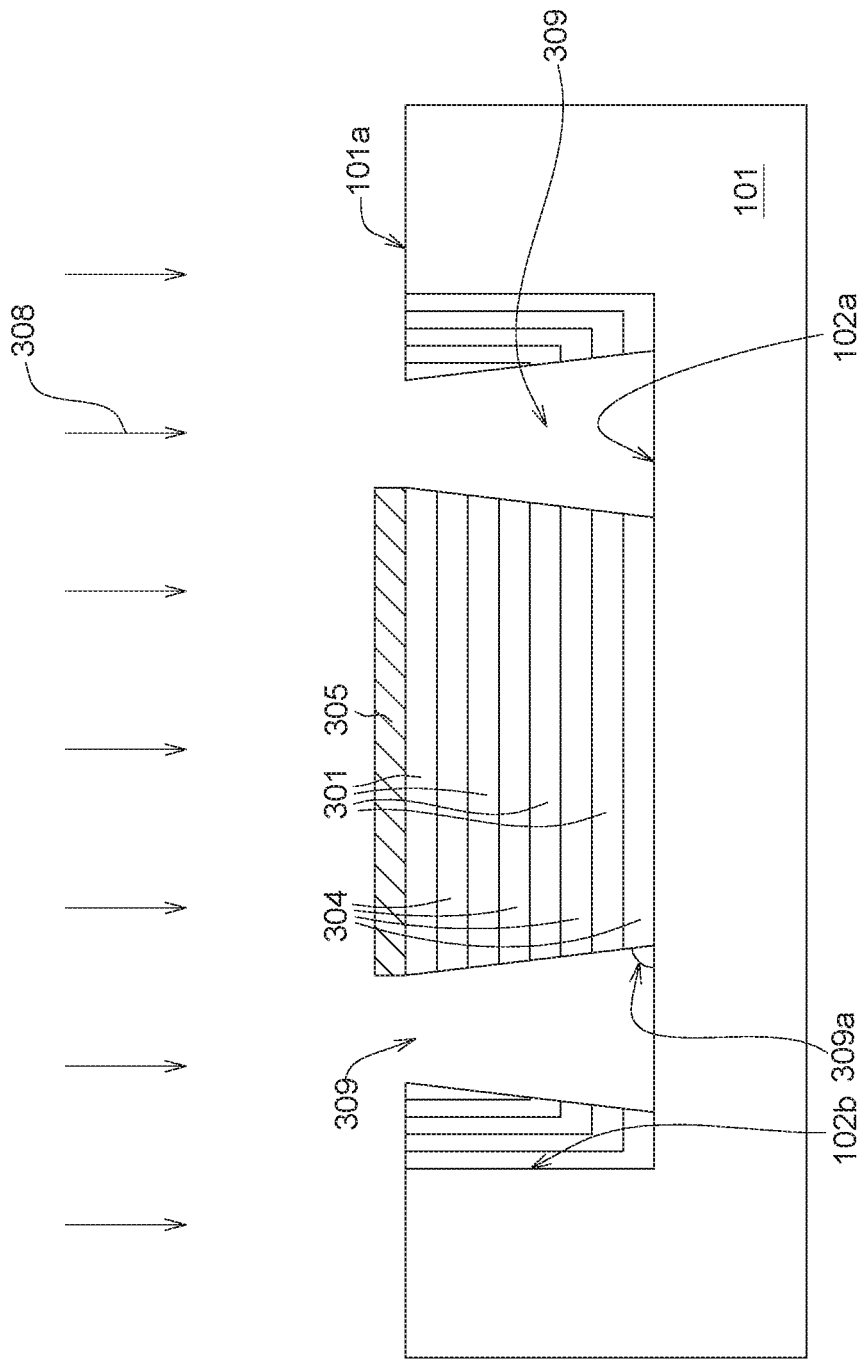

Because the amount of the polymer deposited on the sidewalls of the opening 307 may be less and less from the entrance to the bottom of the opening 307, the stack of the sacrificing layers 301 and the insulating layers 304 subjected to the second etching process 308 can have a cross-sectional profile flared from the surface 101a of the substrate to the bottom surface 102a of the concave portion 102; and the recess 309 resulted from the second etching process 308 can have a cross-sectional bottom profile and a cross-sectional opening profile perpendicular to the direction parallel to the first direction, wherein the cross-sectional bottom profile has a size DB3 substantially greater than a size DT3 of the cross-sectional opening profile (see FIG. 3C). In some embodiments of the present disclosure, the ratio of the size DB3 of cross-sectional bottom profile to the size DT3 of the cross-sectional opening profile may range from 0.5 to 0.9 (0.5<DT2/DB2<0.9).

After the patterned photoresist layer 305 is striped, a capping layer 313 is formed by a deposition process, such as a LPCVD process, covering on the bottom and sidewalls of the recess 309 as well as the surface 101a of the substrate 101. A dielectric material 311 is then deposited on the capping layer 313 and at least partially filling the recess 309. In some embodiments of the present disclosure, the capping layer 313 may be made of silicon nitride. The dielectric material 311 may be identical to or different from the material used to configure the insulating layers 304. In the present embodiment, the dielectric material 311 may include $SiO_2$. The recess 309 can be partially filled with the dielectric material 311 rather than fulfilled. In the present embodiment, the dielectric material 311 merely covers on the sidewalls and the bottom of the recess 309 and seals the opening of the recess 309, whereby an air gap 312 is defined in the recess 309.

Figure 3D:
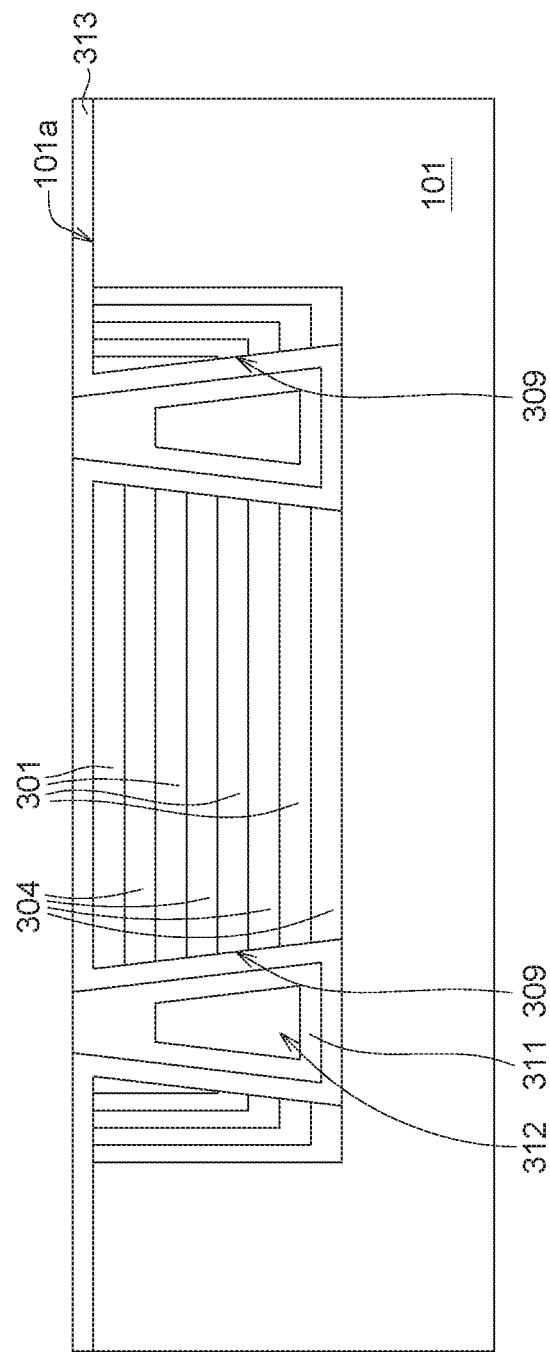

Subsequently, a planarization process, such as a CMP process, is performed to remove the portion of the dielectric material 311 disposed on the surface 101a of the substrate 101, so as to make the top surface of the stack configured by the remaining portions of the sacrificing layers 301 and the insulating layers 304, the top surface of the dielectric material 311 disposed in the recess 309 and the surface 101a of the substrate 101 coplanar (see FIG. 3D). In some embodiments of the present disclosure, the air gap 312 departs from the surface 101a of the substrate 101 for a distance substantially ranging from 500 Å to 1000 Å.

Figure 3E:
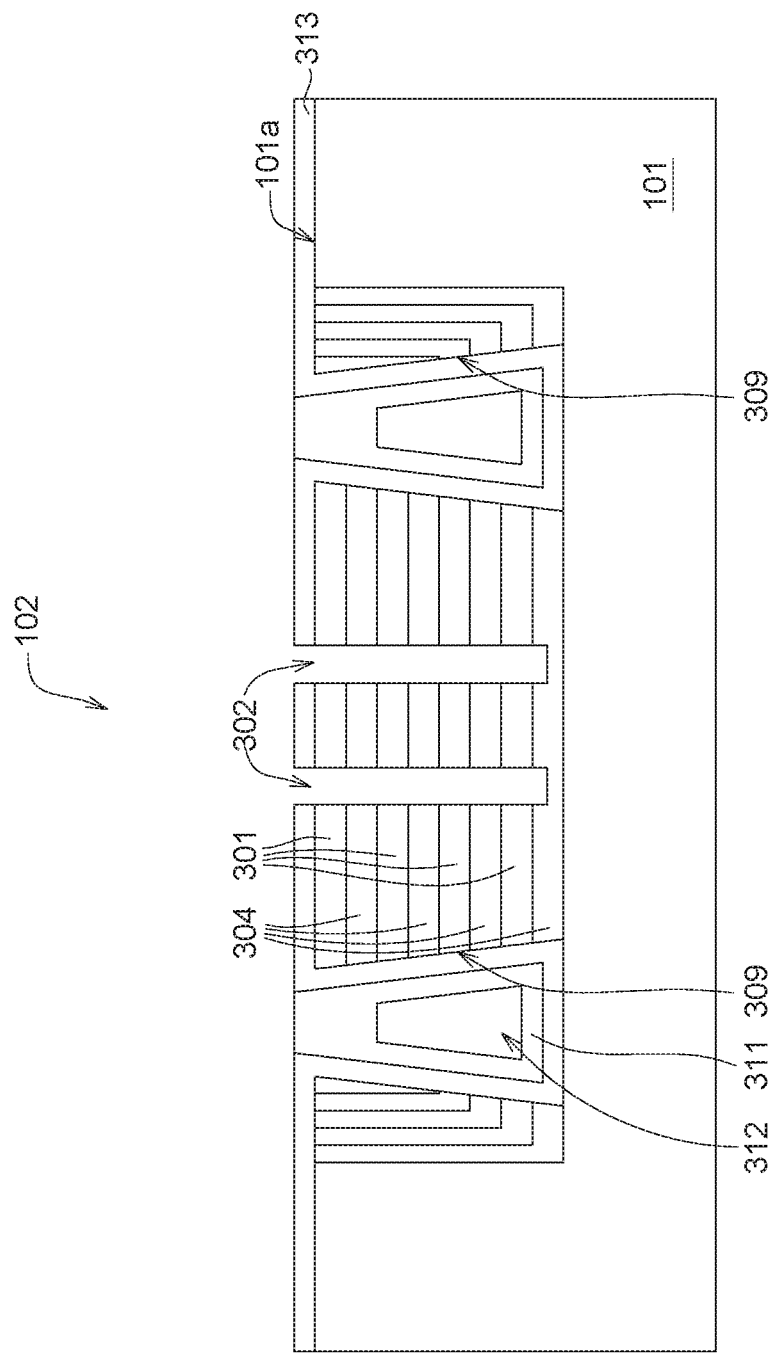
Figure 3F:
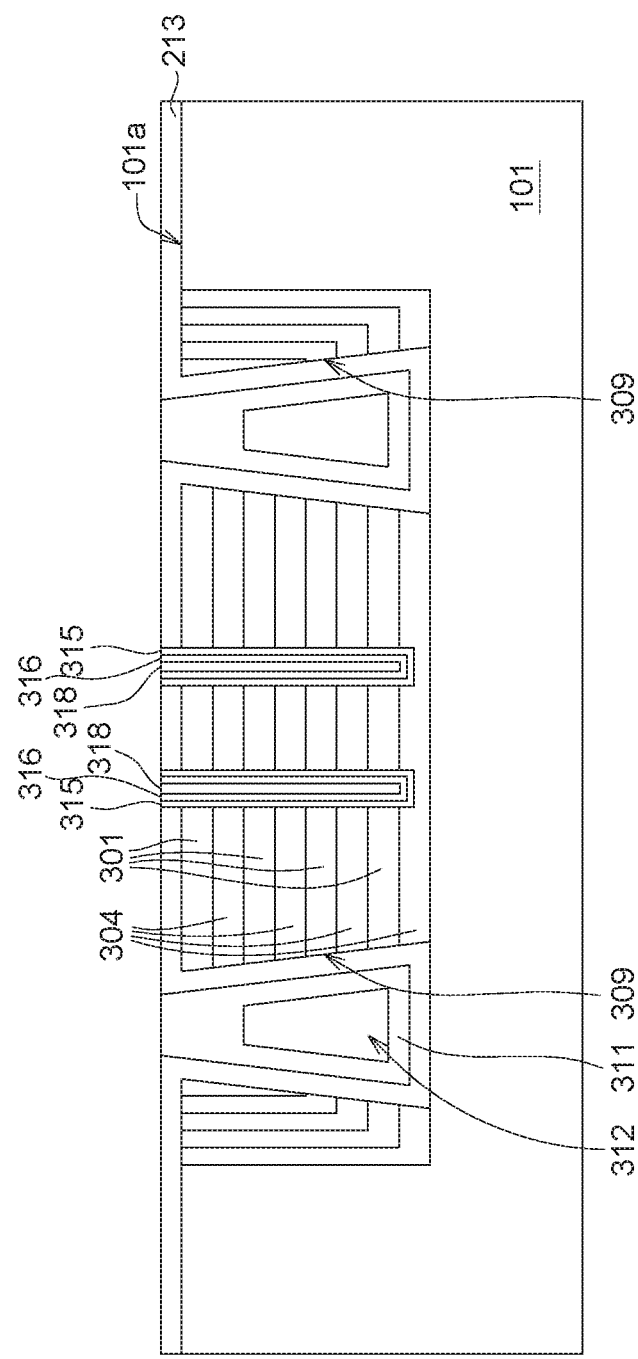
Figure 3G:
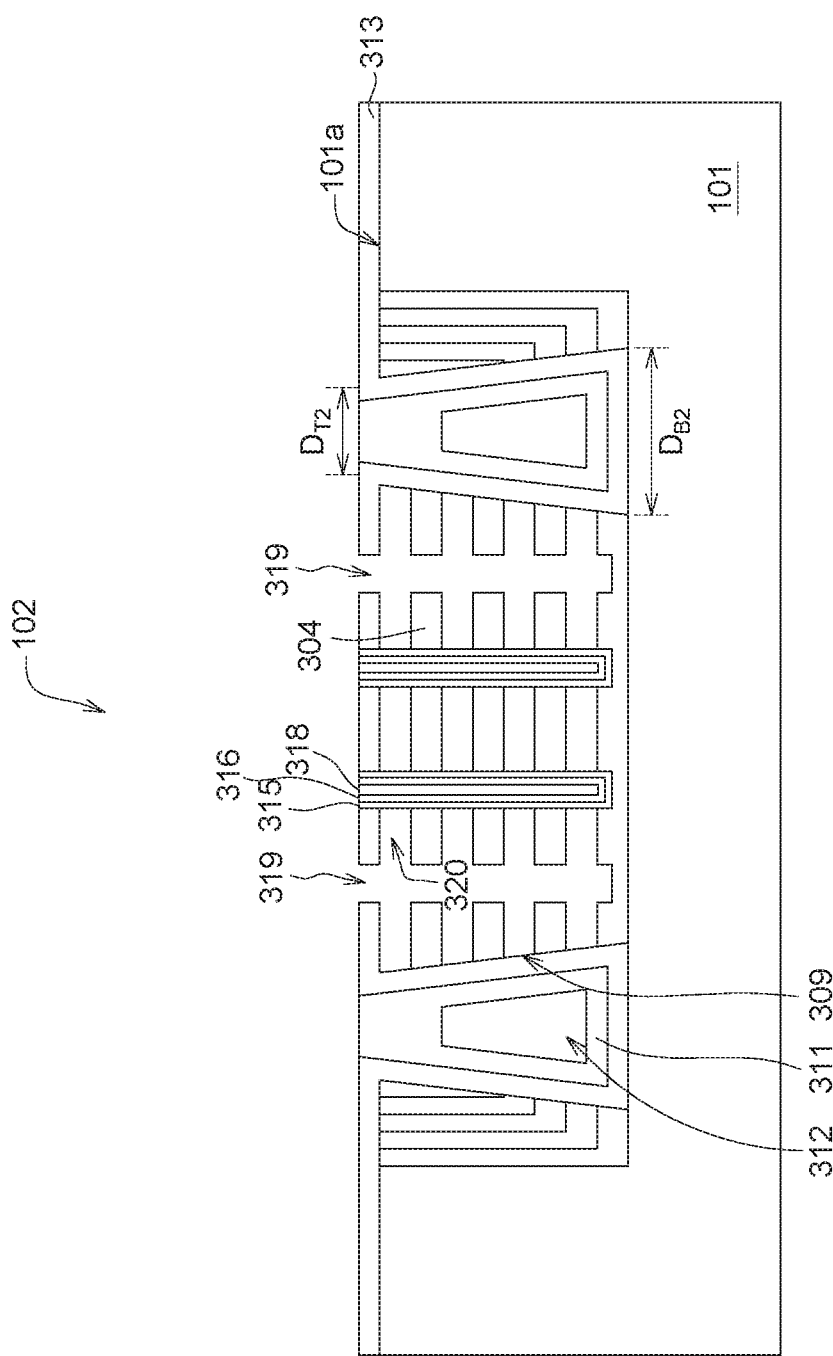

The stack configured by the remaining portions of the sacrificing layers 301 and the insulating layers 304 is then patterned again to form a plurality of through holes 302 passing through the sacrificing layers 301 to expose the bottom-level insulating layer 304 (see FIG. 3E). In some embodiments of the present disclosure, the process for patterning the stack configured by the remaining portions of the sacrificing layers 301 and the insulating layers 304 may include an anisotropic etching process, such as RIE process.

Next, a memory layer 315 and a channel layer 316 are formed in sequence on sidewalls of the through holes 302. Thereafter, a dielectric material 318, such as SiO2 or other suitable dielectric materials, is deposited in the through holes 302 to form a column-shaped vertical channel structure (see FIG. 3F). In the present embodiment, the memory layer 315 may include an ONO composite structure including a silicon oxide layer, a silicon nitride layer and another silicon oxide layer; and the channel layer 316 can be made of un-doped poly-silicon.

After the forming of the memory layer 315 and the channel layer 316, another etching process is performed to form at least one through hole 319 passing through the stack configured by the remaining portions of the sacrificing layers 301 and the insulating layers 304 along the direction parallel to the first direction and to expose portions of the substrate 101, the sacrificing layers 301 and the insulating layers 304 there from. In some embodiments of the present disclosure, the at least one through hole 319 can be a plurality of slits passing through the sacrificing layers 301 and the insulating layers 304.

The remaining portions of the sacrificing layers 301 are then removed. In the present embodiment, phosphoric acid ($H_3PO_4$) solution is utilized to remove the remaining portions of the sacrificing layers 301 through the through holes 319, so as to form a plurality of spaces 320 between the insulating layers 304 and to expose portions of the memory layer 315 (see FIG. 3G).

Thereinafter, a plurality of conductive layers 303 are formed on the positions (the space 320) where the remaining portions of the sacrificing layers 301 initially occupied by a deposition process, such as a LPCVD process. As a result, a multi-layers stack 310 including the conductive layers 303 and the remaining portions of the insulating layer 304 is formed in the concave portion 102 to surround the column-shaped vertical channel structure, meanwhile a plurality of memory cells 317 can be defined at the intersection points of the conductive layers 303, the memory layer 315 and the channel layer 316, so as to form at least one memory cells string vertically connected in series by the channel layer 316 (see FIG. 3H). In some embodiments of the present disclosure, the conductive layers 303 may be made by poly-silicon, metal or other suitable conductive material. In the present embodiment, the conductive layers 303 are a plurality metal layers made of tungsten (W).

Figure 3H:
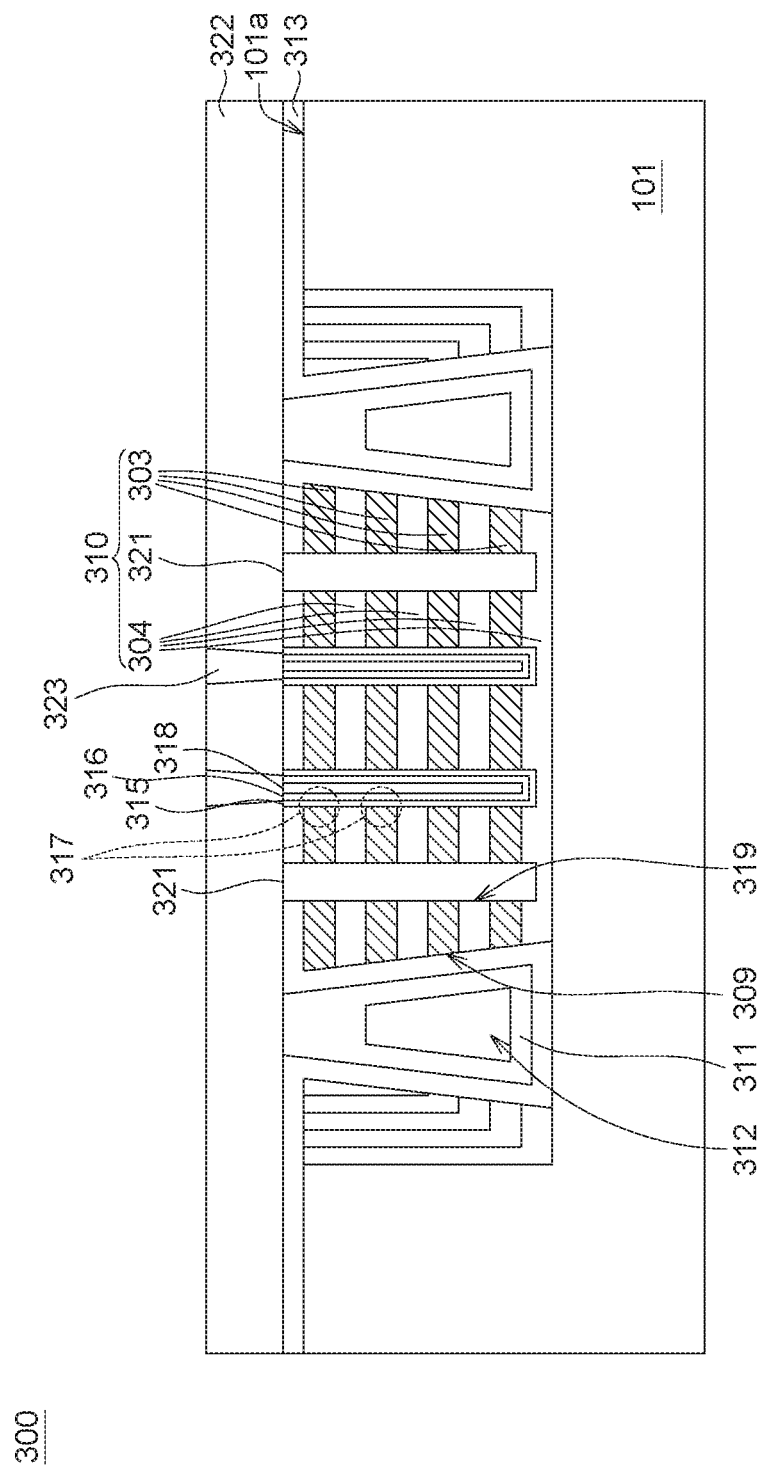

Subsequently, a plurality of downstream processes (not shown) are carried out, a plurality of interconnection structures and connection wires, such as bit lines, word lines, common source line etc., are formed on the column-shaped vertical channel structure, the memory layer 315 and the channel layer 316. Meanwhile, the 3D memory device 300 as shown in FIG. 3H can be accomplished.

Figure 4A:
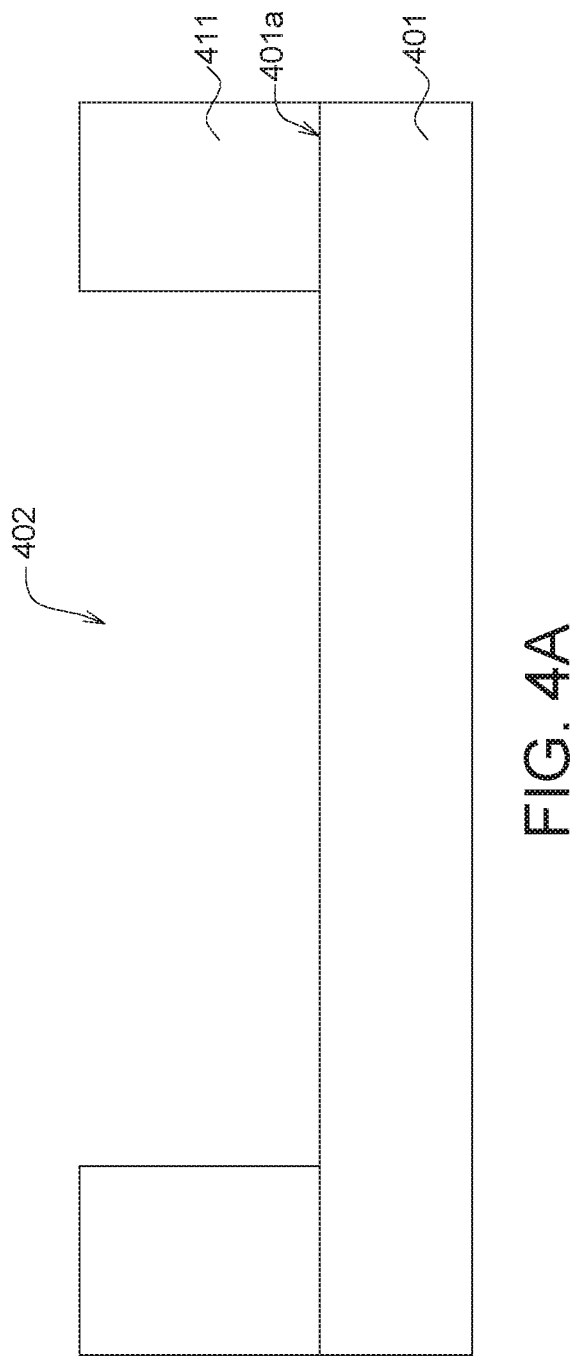
FIGS. 4A to 4B are cross-sectional views illustrating the processing structures for fabricating a 3D memory device, in accordance with yet another embodiment of the present disclosure.
Figure 4B:
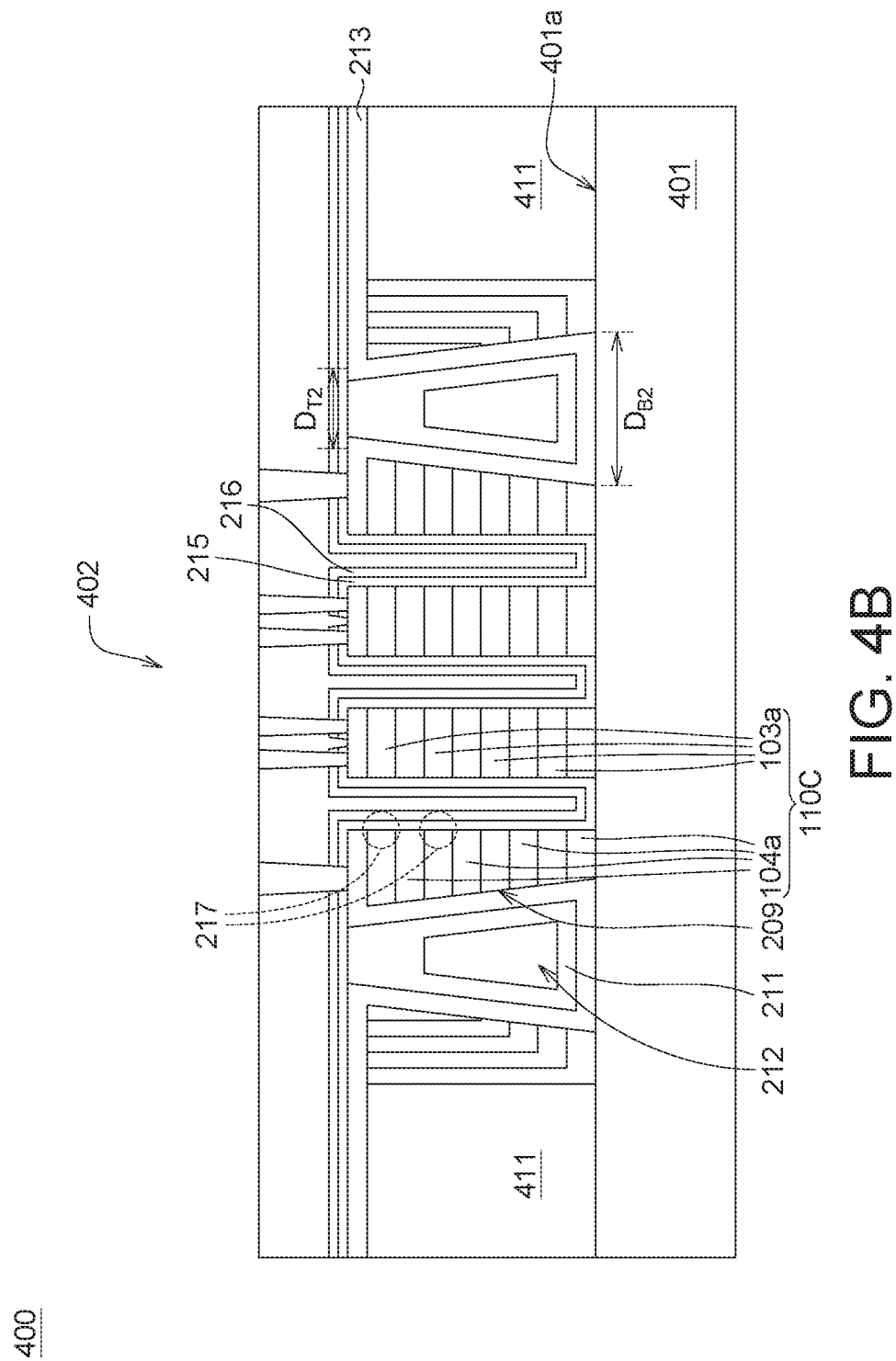

FIGS. 4A to 4B are cross-sectional views illustrating the processing structures for fabricating a 3D memory device 400, in accordance with yet another embodiment of the present disclosure. The structure of the 3D memory device 400 and the process for fabricating the same are similar to that of the 3D memory device 200 except the process for forming the concave portion 402. The method for fabricating the 3D memory device 400 includes steps as follows:

Firstly, a substrate 401 is provided, and a pattered dielectric layer 411 is then formed a surface 401a of the substrate 401, whereby at least one concave portion 402 can be defined by the surface 401a of the substrate 101 and pattered dielectric layer 411 on the surface 401a of the substrate 101 (see FIG. 4A). In some embodiments of the present disclosure, the substrate 101 can be a semiconductor substrate made of semiconductor material, such as n-type poly-silicon, p-type poly-silicon, germanium or other suitable semiconductor material; and the pattered dielectric layer 411 includes silicon oxide. In the present embodiment, the substrate 401 can be made of un-doped poly-silicon; and the pattered dielectric layer 411 can be made of $SiO_2$.

Subsequently, the processes as illustrated in FIGS. 2A to 2E are performed to form the 3D memory device 400 as depicted in FIG. 4B, and the identical process are not redundantly described here.

In accordance with the aforementioned embodiments of the present disclosure, a 3D memory device and the method for fabricating the same are provided. A multi-layers stack having a plurality of conductive layers and a plurality of insulating layers alternatively stacked is formed on a bottom of a concave portion of a substrate, and at least on recess passing through the conductive layers and the insulating layers along the stacking direction of the conductive layers and the insulating layers is formed in the multi-layers stack. The intrinsic stress and the thermal stress resulted in the bending of the substrate can be released, by forming the recess passing through the multi-layers stack.

In some embodiments of the present disclosure, the profile of the recess can be varied to further release the intrinsic stress and the thermal stress imposed by the conductive layers and the insulating layers. For example, a portion of the multi-layers stack is further removed through the recess to form at least one undercut on the bottom of the multi-layers stack, so as to enlarge the recess and to make the recess having a cross-sectional bottom profile and a cross-sectional opening profile perpendicular to the stacking direction of the conductive layers and the insulating layers, wherein the cross-sectional bottom profile has a size substantially greater than that of the cross-sectional opening profile, and the multi-layers stack has a cross-sectional profile flared from the surface of the substrate to the bottom of the concave portion. The bending of the substrate due to the intrinsic stress and the thermal stress can be further avoided by the design of the enlarged recess, and the elements that are subsequently formed on the multi-layers stack can be precisely aligned, and the yield and the performance of the 3D memory device can be improved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three dimensional (3D) memory device comprising:
   a substrate, having a concave portion extending along a first direction into the substrate from a surface thereof;
   a multi-layers stack, including a plurality of conductive layers and a plurality of insulating layers alternatively stacked along the first direction on a bottom of the concave portion, and having at least one recess passing through the conductive layers and the insulating layers along the first direction, wherein the at least one recess has a cross-sectional bottom profile and a cross-sectional opening profile perpendicular to the first direction and the cross-sectional bottom profile has a size substantially greater than that of the cross-sectional opening profile;
   a capping layer, covering sidewalls of the at least one recess and contacting to the plurality of conductive layers; and
   a dielectric material, formed on the capping layer and at least partially filled in the at least one recess.

2. The 3D memory device according to claim 1, wherein the at least one recess extends from a top surface of the multi-layers stack towards the bottom of the concave portion, at least one undercut is formed at the bottom of the multi-layers stack to make the multi-layers stack have a cross-sectional profile flared from the surface of the substrate to the bottom of the concave portion.

3. The 3D memory device according to claim 2, wherein the dielectric material at least partially fills the at least one recess and the at least one recess has an air gap.

4. The 3D memory device according to claim 3, wherein the air gap departs from the top surface of the multi-layers stack for a distance substantially ranging from 500 angstrom (Å) to 1000 Å.

5. The 3D memory device according to claim 1, wherein the multi-layers stack comprises at least one trench formed therein to divide the multi-layers stack into a plurality of ridge stacks each of which has a plurality of conductive stripes and a plurality of insulating stripes; and each two adjacent ones of the conductive stripes are separated from each other by one of the insulating stripes.

6. The 3D memory device according to claim 5, further comprising:
   a memory layer, disposed on at least one sidewall of the ridge stacks; and
   a channel layer, disposed on the memory layer, wherein a plurality of memory cells are defined at a plurality of intersection points of the conductive stripes, the memory layer and the channel layer.

7. The 3D memory device according to claim 1, further comprising:
   a memory layer, disposed on sidewalls of at least one through hole passing through the multi-layers stack along the first direction; and
   a channel layer, disposed on the memory layer, wherein a plurality of memory cells are defined at a plurality of intersection points of the conductive stripes, the memory layer and the channel layer.

8. The 3D memory device according to claim 1, wherein a ratio of the size of cross-sectional bottom profile to the size of the cross-sectional opening profile ranges from 0.5 to 0.9.

\* \* \* \* \*